United States Patent
Jeong et al.

(10) Patent No.: US 12,158,772 B2
(45) Date of Patent: Dec. 3, 2024

(54) CLOCK MULTIPLEXING CIRCUIT

(71) Applicant: Samsung Electronics Co., Ltd., Suwon-si (KR)

(72) Inventors: Yongun Jeong, Suwon-si (KR); Donghyeok Jeong, Suwon-si (KR); ChangSik Yoo, Suwon-si (KR); Kihan Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 26 days.

(21) Appl. No.: 18/170,747

(22) Filed: Feb. 17, 2023

(65) Prior Publication Data
US 2024/0028065 A1 Jan. 25, 2024

(30) Foreign Application Priority Data

Jul. 22, 2022 (KR) .......................... 10-2022-0091304
Sep. 29, 2022 (KR) .......................... 10-2022-0124638

(51) Int. Cl.
*G06F 1/12* (2006.01)

(52) U.S. Cl.
CPC ...................................... *G06F 1/12* (2013.01)

(58) Field of Classification Search
CPC ........................................................ G06F 1/12
USPC ........................................................ 713/400
See application file for complete search history.

(56) References Cited

U.S. PATENT DOCUMENTS

| 5,095,289 | A | * | 3/1992 | Whiteside | ............... H03L 7/089 331/158 |
| 5,644,605 | A | * | 7/1997 | Whiteside | ............... H03L 7/085 327/12 |
| 6,137,340 | A | | 10/2000 | Goodell et al. | |
| 6,433,598 | B1 | * | 8/2002 | Schultz | ...................... G06F 1/10 327/161 |
| 6,564,359 | B2 | | 5/2003 | Saeki | |
| 6,819,141 | B1 | | 11/2004 | Qi et al. | |
| 7,409,631 | B2 | * | 8/2008 | Tschanz | ........... G01R 31/31726 714/724 |
| 7,893,718 | B2 | | 2/2011 | Park et al. | |
| 8,405,425 | B2 | | 3/2013 | Lewis | |
| 9,366,725 | B1 | | 6/2016 | Kapoor et al. | |
| 10,659,017 | B1 | * | 5/2020 | Rengarajan | .......... H03K 3/0372 |
| 2008/0204103 | A1 | * | 8/2008 | Jung | ...................... H03K 5/133 327/261 |

(Continued)

FOREIGN PATENT DOCUMENTS

KR    100423845 B1    5/2004

*Primary Examiner* — Paul R. Myers
(74) *Attorney, Agent, or Firm* — Myers Bigel, P.A.

(57) ABSTRACT

Disclosed is a clock multiplexing circuit which includes a first transistor that is between a first input terminal that receives a first input clock signal and an output terminal that outputs an output pulse signal and operates based on a logic level of a second input terminal receiving a second input clock signal, and a second transistor that is between the output terminal and a first voltage node and operates based on the logic level of the second input terminal. The first input clock signal and the second input clock signal have the same period and have different phases. The output pulse signal transitions to a first logic level at a first time when the first input clock signal transitions to the first logic level and transitions to a second logic level at a second time when the second input clock signal transitions to the first logic level.

20 Claims, 17 Drawing Sheets

(56) References Cited

U.S. PATENT DOCUMENTS

2010/0146320 A1\* 6/2010 Chen ..................... G11C 29/56
713/400

\* cited by examiner

CLOCK MULTIPLEXING CIRCUIT

CROSS-REFERENCE TO RELATED APPLICATIONS

This application claims priority under 35 U.S.C. § 119 to Korean Patent Application Nos. 10-2022-0091304 filed on Jul. 22, 2022, and 10-2022-0124638 filed on Sep. 29, 2022, in the Korean Intellectual Property Office, the disclosures of which are incorporated by reference herein in their entireties.

BACKGROUND

The present disclosure relates to a clock multiplexing circuit. More particularly, the present disclosure relates to a clock multiplexing circuit that receives clock signals of different phases and generates a pulse signal toggling in response to edges of the received clock signals.

A memory device may include various circuits for generating, processing, or storing data. For example, the memory device may include various circuits for storing or outputting data based on a clock signal, a data signal, and a command signal. Nowadays, as the amount of data to be processed in the memory device increases, the frequency of clock signal is increasing in order to increase the speed of data transmission. However, in the case where the frequency of the clock signal increases, the reliability of operation of the memory device that operates in response to the clock signal may decrease.

SUMMARY

Embodiments of the present disclosure provide a clock multiplexing circuit of a simpler structure.

According to some embodiments, a clock multiplexing circuit may include a first transistor that is between a first input terminal that is configured to receive a first input clock signal and an output terminal that is configured to output an output pulse signal and operates based on a logic level of a second input terminal that is configured to receive a second input clock signal, and a second transistor that is between the output terminal and a first voltage node and is configured to operate based on the logic level of the second input terminal. The first input clock signal and the second input clock signal may have the same period and have different phases. The output pulse signal may transition to a first logic level at a first time when the first input clock signal transitions to the first logic level and may transition to a second logic level at a second time when the second input clock signal transitions to the first logic level.

According to some embodiments, a pulse generator may include a phase shifter that outputs a 4-phase clock signal including a first to a fourth clock signals whose phases are different from each other, and a clock multiplexer that includes a first to a fourth clock multiplexing circuits. The first to fourth clock multiplexing circuits may respectively output a first to a fourth pulse signals having different phases from one another based on the 4-phase clock signal. The first clock multiplexing circuit may include a first transistor that is between a first input node that is configured to receive the first clock signal and an output node that is configured to output the first pulse signal at the output node and operates based on a logic level of a second input node that is configured to receive the second clock signal, and a second transistor that is between the first output node and a first voltage node and is configured to operate based on the logic level of the second input node.

According to some embodiments, a memory device may include a clock multiplexer that is configured to generate a first to an n-th pulse signals (n is a natural number greater than or equal to 4) based on an n-phase clock signal including a first to an n-th clock signals, a memory cell array that is configured to output a first to an m-th data (m is a natural number equal to or greater than 4) in parallel, and a serializer that is configured to sequentially output the first to m-th data to a first data pad in response to the first to n-th pulse signals. The clock multiplexer may include a first to an n-th clock multiplexing circuits configured to generate the first to n-th clock signals, respectively. The first clock multiplexing circuit may include a first transistor that is between a first input node and a first output node. The first transistor is configured to output the first pulse signal and configured to operate based on a logic level of a second input node receiving the second clock signal, and a second transistor that is between the first output node and a first voltage node and is configured to operate based on the logic level of the second input node.

BRIEF DESCRIPTION OF THE DRAWINGS

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that one skilled in the art easily carries out the present disclosure. In the following description, specific details such as detailed components and structures are merely provided to assist the overall understanding of embodiments of the present disclosure. Therefore, it should be apparent to those skilled in the art that various changes and modifications of the embodiments described herein may be made without departing from the scope and spirit of the invention. In addition, the descriptions of well-known functions and structures are omitted for clarity and brevity. In the following drawings and/or in the detailed description, components may be connected with any other components except for components illustrated in a drawing or described in the detailed description. The terms described in the specification are terms defined in consideration of the functions in the present disclosure and are not limited to a specific function. The definitions of the terms should be determined based on the contents throughout the specification.

Components that are described in the detailed description with reference to the terms "circuit", "block", etc. will be implemented with software, hardware, or a combination thereof. For example, the software may be a machine code, firmware, an embedded code, and/or application software. For example, the hardware may include an electrical circuit, an electronic circuit, a processor, a computer, integrated circuit cores, a pressure sensor, a micro electro mechanical system (MEMS), a passive element, or a combination thereof.

Figure 1:
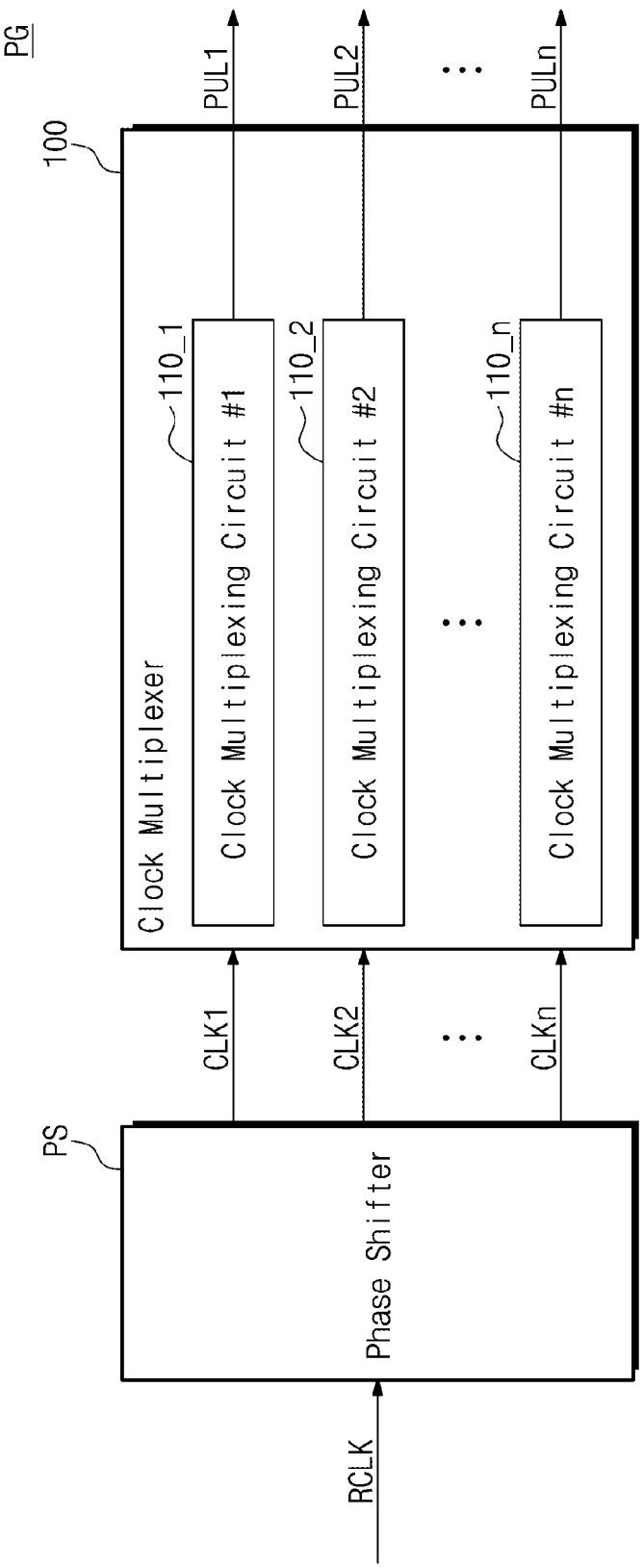
FIG. 1 is a block diagram illustrating a pulse generator according to some embodiments of the present disclosure.

FIG. 1 is a block diagram illustrating a pulse generator according to some embodiments of the present disclosure. Referring to FIG. 1, a pulse generator PG may include a phase shifter PS and a clock multiplexer 100.

The phase shifter PS may receive a reference clock RCLK. The phase shifter PS may generate an n-phase clock signal based on the reference clock RCLK. For example, the phase shifter PS may output first to n-th clock signals CLK1 to CLKn that are generated by delaying the reference clock RCLK by different phases. That is, the n-phase clock signal may include the first to n-th clock signals CLK1 to CLKn.

In some embodiments, the first to n-th clock signals CLK1 to CLKn may have the same period and may have different phases.

In some embodiments, "n" may be an integer of 4 or more. For example, when "n" is 4, the n-phase clock signal may include the first to fourth clock signals CLK1 to CLK4. In this case, two clock signals adjacent to each other from among the first to fourth clock signals CLK1 to CLK4 may have a phase difference of degrees. That is, the second clock signal CLK2 may be lag behind the first clock signal CLK1 as much as 90 degrees; the third clock signal CLK3 may be lag behind the first clock signal CLK1 as much as 180 degrees; the fourth clock signal CLK4 may be lag behind the first clock signal CLK1 as much as 270 degrees. Below, for brief description, some embodiments where "n" is 4 will be described representatively. However, the present disclosure is not limited thereto. For example, "n" may be an integer of 8, 16, etc. In particular, some embodiments where "n" is 8 will be described in detail with reference to FIGS. 13 and 14.

In some embodiments, "n" may be an integer of 4 or more.

In some embodiments, the pulse generator PG may be included in a memory device. Also, the pulse generator PG may receive the reference clock RCLK from the outside. That is, the reference clock RCLK may be provided from the outside of or from external to the memory device. For example, the reference clock RCLK may be provided from a memory controller.

The clock multiplexer 100 may include a first clock multiplexing circuit (clock multiplexing circuit #1) 110_1 to an n-th clock multiplexing circuit (clock multiplexing circuit #n) 110_n. The first to n-th clock multiplexing circuits 110_1 to 110_n may multiplex the n-phase clock signal to output first to n-th pulse signals PUL1 to PULn.

Each of the first to n-th clock multiplexing circuits 110_1 to 110_n may generate a pulse signal based on two different clock signals among the first to n-th clock signals CLK1 to CLKn. For example, each of the first to n-th clock multiplexing circuits 110_1 to 110_n may generate a pulse signal based on two clock signals adjacent to each other from among clock signals included in the n-phase clock signal. In detail, the k-th clock multiplexing circuit 110_k being one of the first to (n–1)-th clock multiplexing circuits 110_1 to 110_n–1 may generate a k-th pulse signal PULk based on the k-th clock signal CLKk and the (k+1)-th clock signal CLKk+1. The n-th clock multiplexing circuit 110_n may generate an n-th pulse signal PULn based on the n-th clock signal CLKn and the first clock signal CLK1. A configuration of the clock multiplexer 100 and an operation of each of the first to n-th clock multiplexing circuits 110_1 to 110_n will be described in detail with reference to the following drawings.

In some embodiments, clock signals, which have a phase difference of 360/n degrees, from among clock signals included in the n-phase clock signal may be described to be adjacent to each other. For example, clock signals, which have a phase difference of 90 degrees, from among the clock signals included in the n-phase clock signal may be described to be adjacent to each other.

Figure 2:
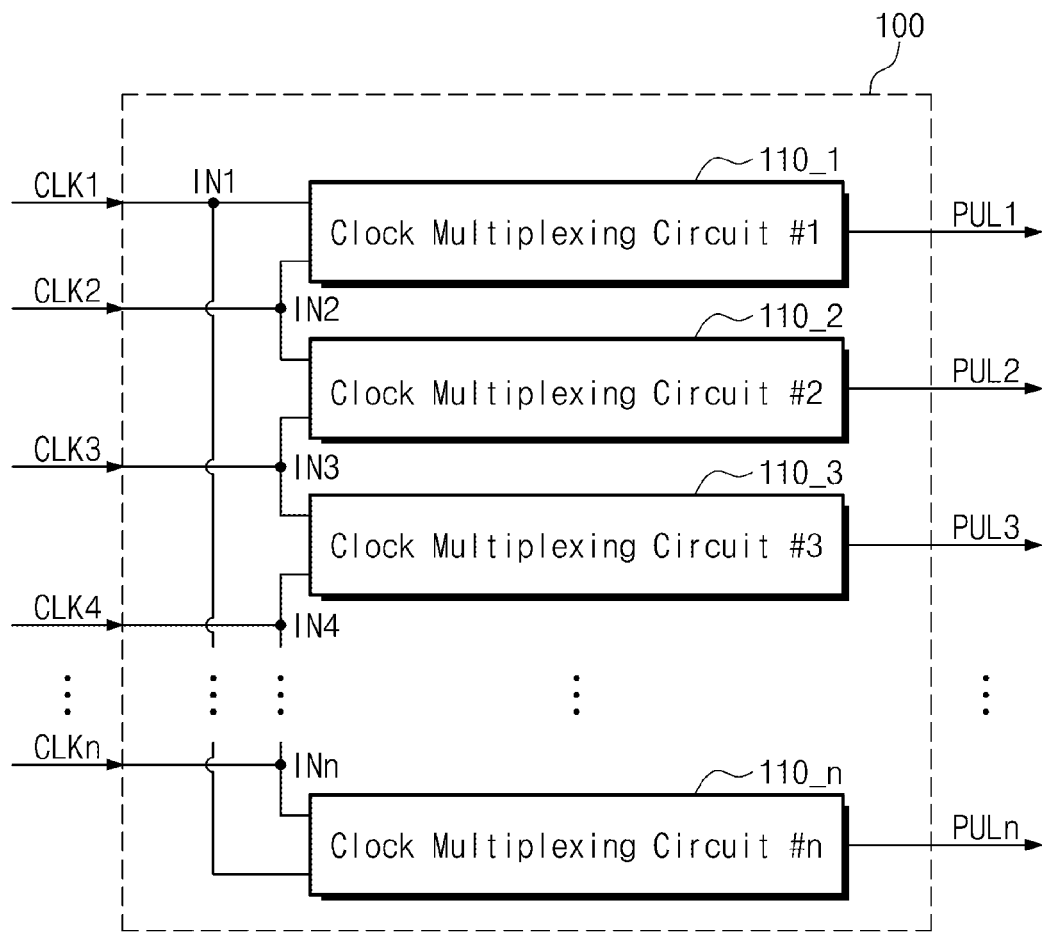
FIG. 2 is a block diagram illustrating a clock multiplexer of FIG. 1 in detail.

FIG. 2 is a block diagram illustrating a clock multiplexer of FIG. 1 in detail. Referring to FIGS. 1 and 2, the clock multiplexer 100 may include the first to n-th clock multiplexing circuits 110_1 to 110_n.

The clock multiplexer 100 may include first to n-th input nodes IN1 to INn. The clock multiplexer 100 may receive the first to n-th clock signals CLK1 to CLKn through the first to n-th input nodes IN1 to INn. For example, the first clock signal CLK1 may be provided to the first input node IN1, and the n-th clock signal CLKn may be provided to the n-th input node INn.

Each of the first to n-th clock multiplexing circuits 110_1 to 110_n may generate a pulse signal based on two clock signals adjacent to each other from among clock signals included in the n-phase clock signal. In other words, each of the clock multiplexing circuits 110_1 to 110_n may generate pulse signal based on two clock signals that are 90 degrees offset in phase from one another. For example, the k-th clock multiplexing circuit 110_k being one of the first to n-th clock multiplexing circuits 110_1 to 110_n may be connected with the k-th input node INk and the (k+1)-th input node INk+1. The n-th clock multiplexing circuit 110_n may be connected with the n-th input node INn and the first input node IN1.

Each of the first to n-th clock multiplexing circuits 110_1 to 110_n may receive clock signals of different phases from input nodes connected therewith. Each of the first to n-th clock multiplexing circuits 110_1 to 110_n may generate a pulse signal based on the received clock signals. For example, the first clock multiplexing circuit 110_1 may receive the first clock signal CLK1 through the first input node IN1 and may receive the second clock signal CLK2 through the second input node IN2. In this case, the first clock multiplexing circuit 110_1 may generate the first pulse signal PUL1 based on the first clock signal CLK1 and the second clock signal CLK2. An operation of each of the first to n-th clock multiplexing circuits 110_1 to 110_n will be described in detail with reference to the following drawings.

Figure 3:
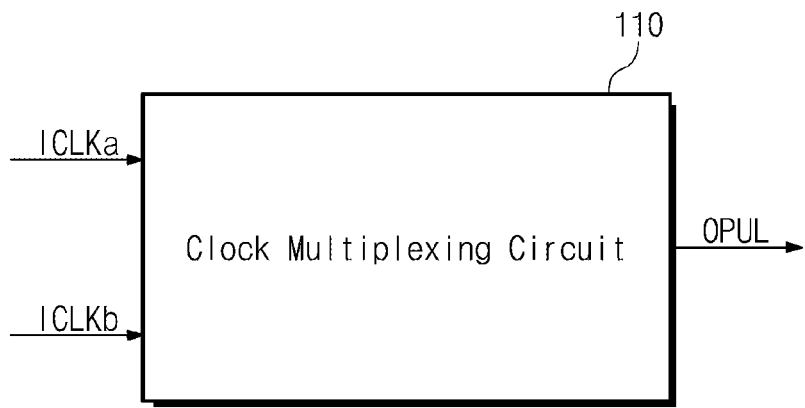
FIG. 3 is a block diagram illustrating a clock multiplexing circuit of FIG. 1.

FIG. 3 is a block diagram illustrating a clock multiplexing circuit of FIG. 1. Referring to FIGS. 1 and 3, a clock multiplexing circuit 110 may receive a first input clock signal ICLKa and a second input clock signal ICLKb. The clock multiplexing circuit 110 may output an output pulse signal OPUL based on the first input clock signal ICLKa and the second input clock signal ICLKb.

The clock multiplexing circuit 110 may correspond to one or more of the first to n-th clock multiplexing circuits 110_1 to 110_n. For example, the first clock multiplexing circuit 110_1 may be the clock multiplexing circuit 110. In this case, the first input clock signal ICLKa may correspond to the first clock signal CLK1, and the second input clock signal ICLKb may correspond to the second clock signal CLK2. The output pulse signal OPUL may correspond to the first pulse signal PUL1 from FIG. 2.

In some embodiments, the first input clock signal ICLKa may be ahead of the second input clock signal ICLKb. That is, the first input clock signal ICLKa may lead ahead the second input clock signal ICLKb, and the second input clock signal ICLKb may lag behind the first input clock signal ICLKa. For example, the first input clock signal ICLKa and the second input clock signal ICLKb may be clock signals, which have different phases (or are adjacent to each other), from among clock signals included in the n-phase clock signal. In detail, the first input clock signal ICLKa and the second input clock signal ICLKb may have a phase difference of 360/n degrees. The first input clock signal ICLKa and the second input clock signal ICLKb may have a same frequency or period, but a different phase. However, the present disclosure is not limited thereto.

The output pulse signal OPUL may toggle in response to edges of the first input clock signal ICLKa and/or the second input clock signal ICLKb. For example, the output pulse signal OPUL may toggle in response to edges, which are different in type, from among the edges of the first input clock signal ICLKa and/or the second input clock signal ICLKb. In some embodiments, the output pulse signal OPUL may toggle in response to edges, which are identical in type, from among the edges of the first input clock signal ICLKa and/or the second input clock signal ICLKb.

The clock multiplexing circuit 110 that generates the output pulse signal OPUL toggling in response to edges, which are different in type, from among edges of input clock signals will be described in detail with reference to FIG. 4.

The clock multiplexing circuit 110 that generates the output pulse signal OPUL toggling in response to edges, which are identical in type, from among edges of input clock signals will be described in detail with reference to FIGS. 5 to 14.

In some embodiments, the clock multiplexing circuit 110 may include a first input terminal, a second input terminal, and an output terminal. In this case, the clock multiplexing circuit 110 may receive the first input clock signal ICLKa through the first input terminal, may receive the second input clock signal ICLKb through the second input terminal, and may output the output pulse signal OPUL through the output terminal.

In some embodiments, the clock multiplexing circuit 110 may include two transistors whose channel types are different. The clock multiplexing circuit 110 that includes two transistors whose channel types are different will be described in detail with reference to FIGS. 7 and 10.

Figure 4:
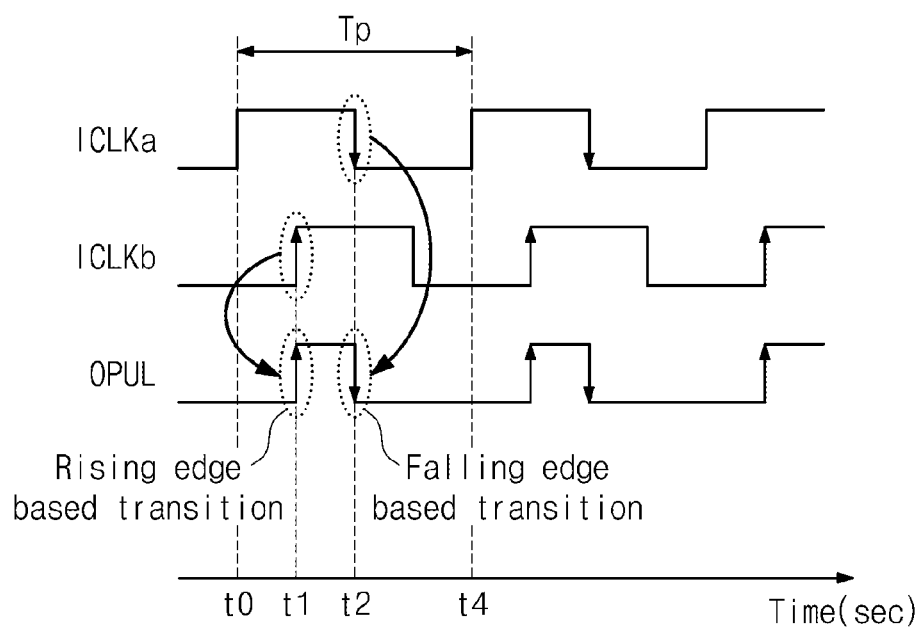
FIG. 4 is a timing diagram illustrating an output pulse signal toggling in response to different-type edges of first and second input clock signals.

FIG. 4 is a timing diagram illustrating an output pulse signal toggling in response to different-type edges of first and second input clock signals. In FIG. 4, a horizontal axis represents a time, and a vertical axis represents a logic level of a signal.

For briefer description, below, the output pulse signal OPUL that toggles in response to a rising edge of the second input clock signal ICLKb and a falling edge of the first input clock signal ICLKa will be described representatively. Also, below, some embodiments where the first input clock signal ICLKa and the second input clock signal ICLKb are included in a 4-phase clock signal will be described representatively. However, the present disclosure is not limited thereto.

The first input clock signal ICLKa and the second input clock signal ICLKb may have the same period. For example, each of the first input clock signal ICLKa and the second input clock signal ICLKb may have a period Tp.

The second input clock signal ICLKb may be lag behind the first input clock signal ICLKa as much as 90 degrees (i.e., as much as 360/n degrees when "n" is 4). For example, the first input clock signal ICLKa may transition from a logic low level to a logic high level at a 0th time t0. That is, the first input clock signal ICLKa may have the rising edge at the 0th time t0. The second input clock signal ICLKb may transition from the logic low level to the logic high level at a first time t1 later than the time t0. That is, the second input clock signal ICLKb may have the rising edge at the first time t1. In this case, a time interval from the 0th time t0 to the first time t1 may be ¼ of the period Tp.

The first input clock signal ICLKa may transition from the logic high level to the logic low level at a second time t2. That is, the first input clock signal ICLKa may have the falling edge at the second time t2. In this case, a time interval from the 0th time t0 to the second time t2 may be ½ of the period Tp.

The output pulse signal OPUL may transition from the logic low level to the logic high level at the first time t1. That is, the output pulse signal OPUL may transition to the logic high level in response to the rising edge of the second input clock signal ICLKb. The output pulse signal OPUL may transition from the logic high level to the logic low level at the second time t2. That is, the output pulse signal OPUL may transition to the logic low level in response to the falling edge of the first input clock signal ICLKa.

In some embodiments, the output pulse signal OPUL may have the same period as the first input clock signal ICLKa and the second input clock signal ICLKb. For example, in a next period of the first input clock signal ICLKa and the second input clock signal ICLKb, the logic level of the output pulse signal OPUL may transition in a manner similar to the above manner.

In some embodiments, the clock multiplexing circuit 110 that is implemented to perform a logical operation such as an AND, NAND, OR, or NOR operation may output the output pulse signal OPUL based on the first input clock signal ICLKa and the second input clock signal ICLKb. In this case, the time interval from the first time t1 when the output pulse signal OPUL transitions from the logic low level to the logic high level to the second time t2 when the output pulse signal OPUL transitions from the logic high level to the logic low level may be determined based on a rising edge time point of the second input clock signal ICLKb and a falling edge time point of the first input clock signal ICLKa. Accordingly, for the fine (or accurate) operation of the clock multiplexing circuit 110, there may be a need to accurately determine the falling edge time point of the clock signal, as well as the rising edge time point of the clock signal. However, technically, it may be significantly difficult to generate a high-frequency n-phase clock signal where both the rising edge time point and the falling edge time point are accurate.

As such, instead of the structure where the clock multiplexing circuit 110 generates the output pulse signal OPUL toggling in response to different-type edges of input clock signals, the clock multiplexing circuit 110 may be implemented to generate the output pulse signal OPUL toggling in response to edges, which are identical in type, from among edges of the input clock signals. Accordingly, embodiments where the clock multiplexing circuit 110 generates the output pulse signal OPUL toggling in response to edges, which are identical in type, from among the edges of the input clock signals will be described with reference to FIGS. 5 to 14.

Figure 5:
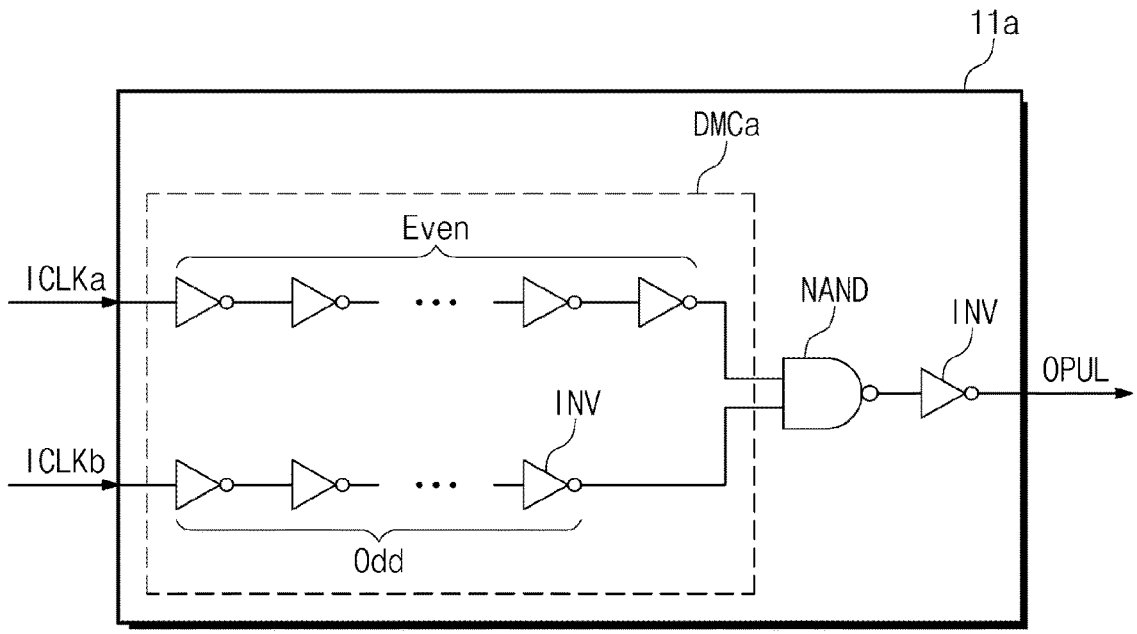
FIG. 5 is a circuit diagram illustrating a clock multiplexing circuit of FIG. 3, according to some embodiments.

FIG. 5 is a circuit diagram illustrating a clock multiplexing circuit of FIG. 3, according to some embodiments. Referring to FIGS. 3 and 5, a clock multiplexing circuit 11a may include a delay matching circuit DMCa and a NAND gate NAND.

The delay matching circuit DMCa may receive the first input clock signal ICLKa and may provide a first input terminal of the NAND gate NAND with a signal whose phase is identical to that of the first input clock signal ICLKa. For example, the delay matching circuit DMCa may provide the first input clock signal ICLKa to the first input terminal of the NAND gate NAND through an inverter string including the even number of inverters INV.

The delay matching circuit DMCa may receive the second input clock signal ICLKb and may provide a second input terminal of the NAND gate NAND with a signal whose phase is opposite to that of the second input clock signal ICLKb. For example, the delay matching circuit DMCa may provide the second input clock signal ICLKb to the second input terminal of the NAND gate NAND through an inverter string including the odd number of inverters INV.

The delay matching circuit DMCa may delay the first input clock signal ICLKa and the second input clock signal ICLKb as much as the same time length so as to be respectively provided to the input terminals of the NAND gate NAND. For example, a delay between the first input clock signal ICLKa and the signal provided to the first input terminal of the NAND gate NAND may be identical to a delay between the second input clock signal ICLKb and the signal provided to the second input terminal of the NAND gate NAND.

The NAND gate NAND may perform a NAND operation on the signals received from the delay matching circuit DMCa. The NAND gate NAND may provide a result of the NAND operation to an inverter INV. The inverter INV that receives the NAND operation result may output the output pulse signal OPUL.

In this case, the output pulse signal OPUL may toggle in response to edges of the input clock signals, which have the same type. For example, the output pulse signal OPUL may transition from the logic low level to the logic high level at the rising edge time point of the first input clock signal ICLKa, and may transition from the logic high level to the logic low level at the rising edge time point of the second input clock signal ICLKb. The output pulse signal OPUL toggling in response to edges of input clock signals, which have the same type, will be described in detail with reference to FIG. 8.

However, according to the embodiment of FIG. 5, a plurality of inverters INV may be required to delay the second input clock signal ICLKb as much as the same time length as the first input clock signal ICLKa, with the phase of the second input clock signal ICLKb inverted. In this case, the size of the clock multiplexing circuit 11a may become larger, and power consumption of the clock multiplexing circuit 11a may increase. Also, because inverter strings, the numbers of which are different, are configured to cause delays of the same length, the manufacturing yield of the pulse generator PG may decrease.

Figure 6:
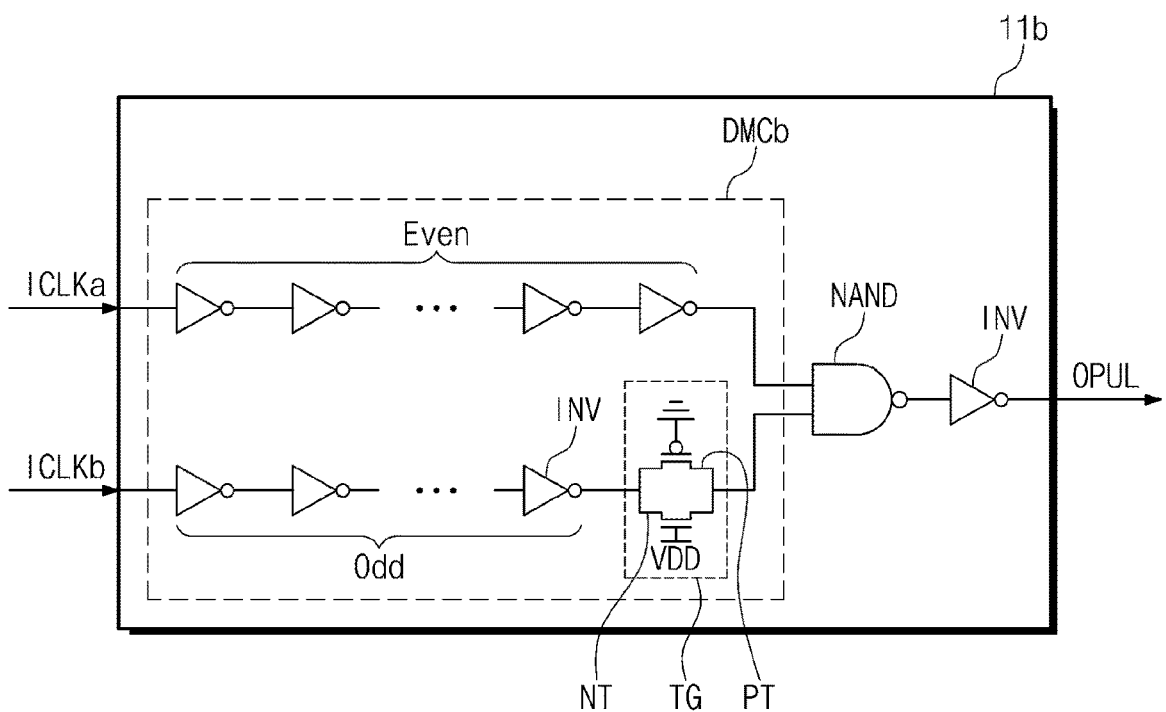
FIG. 6 is a circuit diagram illustrating a clock multiplexing circuit of FIG. 3, according to some embodiments.

FIG. 6 is a circuit diagram illustrating a clock multiplexing circuit of FIG. 3, according to some embodiments. Referring to FIGS. 3 and 6, a clock multiplexing circuit 11b may include a delay matching circuit DMCb and a NAND gate NAND.

The delay matching circuit DMCb may receive the first input clock signal ICLKa and may provide the first input terminal of the NAND gate NAND with a signal whose phase is identical to that of the first input clock signal ICLKa. For example, the delay matching circuit DMCb may provide the first input clock signal ICLKa to the first input terminal of the NAND gate NAND through an inverter string including the even number of inverters INV.

The delay matching circuit DMCb may receive the second input clock signal ICLKb and may provide the second input terminal of the NAND gate NAND with a signal whose phase is opposite to that of the second input clock signal ICLKb. For example, the delay matching circuit DMCb may provide the second input clock signal ICLKb to the second input terminal of the NAND gate NAND through an inverter string, which includes the odd number of inverters INV, and a transmission gate TG.

In some embodiments, the transmission gate TG may include a p-channel metal-oxide-semiconductor (PMOS) transistor PT and an n-channel metal-oxide-semiconductor (NMOS) transistor NT connected in parallel. A gate terminal of the PMOS transistor PT may be connected with a ground voltage, and a gate terminal of the NMOS transistor may be connected with a power supply voltage VDD.

An inverter INV may be connected with an output terminal of the NAND gate NAND of the clock multiplexing circuit 11b. Functions of the NAND gate NAND and the inverter INV of the clock multiplexing circuit 11b are similar to those described above, and thus, additional description will be omitted to avoid redundancy.

In some embodiments related to FIG. 6, as in the description given with reference to FIG. 5, the output pulse signal OPUL may toggle in response to edges of input clock signals, which have the same type. The output pulse signal OPUL toggling in response to edges of input clock signals, which have the same type, will be described in detail with reference to FIG. 8.

However, according to the embodiments of FIG. 6, the transmission gate TG may be used to cause inverter delays of the same length without inverting a phase of a passing signal. In this case, because the clock signal passes through the transmission gate TG, the slope of the rising and falling edges of the clock signal may decrease. As such, the accuracy of operation of the electronic device operating based on the clock signal may decrease.

Figure 7:
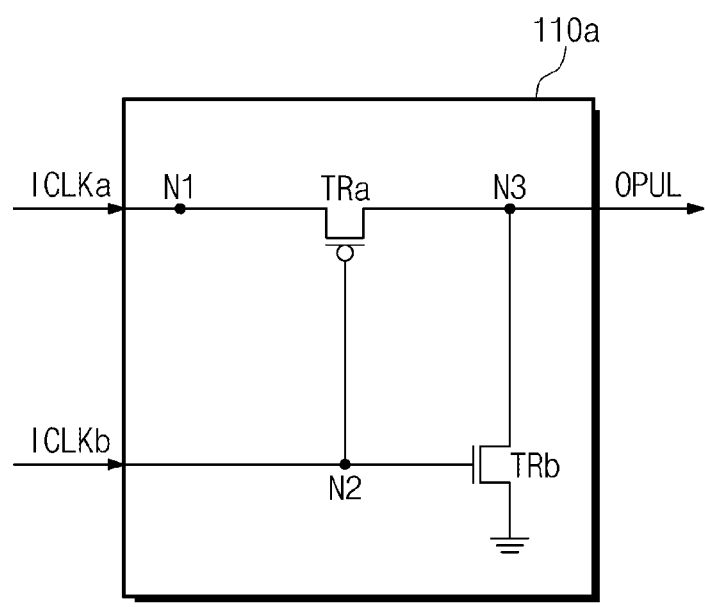
FIG. 7 is a circuit diagram illustrating a clock multiplexing circuit of FIG. 3, according to some embodiments.

FIG. 7 is a circuit diagram illustrating a clock multiplexing circuit of FIG. 3, according to some embodiments. Referring to FIG. 7, a clock multiplexing circuit 110a may receive the first input clock signal ICLKa through a first node N1. The clock multiplexing circuit 110a may receive the second input clock signal ICLKb through a second node N2.

In some embodiments, the first node N1 may be connected with the first input terminal of the clock multiplexing circuit 110 of FIG. 3, the second node N2 may be connected with the second input terminal of the clock multiplexing circuit 110 of FIG. 3, and a third node N3 may be connected with the output terminal of the clock multiplexing circuit 110 of FIG. 3.

The clock multiplexing circuit 110a may include a first transistor TRa and a second transistor TRb. A channel of the first transistor TRa may be different in type from a channel of the second transistor TRb. For example, the first transistor TRa may be a PMOS transistor, and the second transistor TRb may be an NMOS transistor. However, the present disclosure is not limited thereto.

The first transistor TRa may be connected between the first node N1 and the third node N3. The first transistor TRa may operate in response to the logic level of the second node N2. For example, the first transistor TRa may operate in response to the logic level of the second input clock signal ICLKb input to the second node N2.

In detail, the first transistor TRa may be turned on when the second input clock signal ICLKb is at the logic low level. In this case, the logic level of the third node N3 may be set to the logic level of the first node N1 (i.e., the logic level of the first input clock signal ICLKa). In contrast, the first transistor TRa may be turned off when the second input clock signal ICLKb is at the logic high level.

The second transistor TRb may be connected between the third node N3 and the ground voltage. The second transistor TRb may operate in response to a logic level of the second node N2. For example, the second transistor TRb may operate in response to the logic level of the second input clock signal ICLKb input to the second node N2.

In detail, the second transistor TRb may be turned on when the second input clock signal ICLKb is at the logic high level. In this case, the logic level of the third node N3 may be set to the logic level (i.e., the logic low level) corresponding to the ground voltage. In contrast, the second transistor TRb may be turned off when the second input clock signal ICLKb is at the logic low level.

The logic level of the output pulse signal OPUL may correspond to the logic level of the third node N3. That is, when the second input clock signal ICLKb is at the logic high level, the logic level of the output pulse signal OPUL may be at the logic low level. When the second input clock signal ICLKb is at the logic low level, the logic level of the output pulse signal OPUL may be identical to the logic level of the first input clock signal ICLKa.

That is, according to the embodiments of FIG. 7, as in the description given with reference to FIGS. 5 and 6, the clock multiplexing circuit 110a may generate the output pulse signal OPUL toggling in response to edges of input clock signals, which have the same type. The output pulse signal OPUL toggling in response to edges of input clock signals, which have the same type, will be described in detail with reference to FIG. 8.

In particular, according to the embodiment of FIG. 7, the clock multiplexing circuit 110a may generate the output pulse signal OPUL transitioning at the same timing as the output pulse signals illustrated in FIGS. 5 and 6 without including the plurality of inverters INV, the transmission gate TG, and the NAND gate NAND. That is, according to some embodiments of the present disclosure, a clock multiplexing circuit that performs the same function including a smaller number of transistors may be provided. In the clock multiplexing circuit 110a according to some embodiments of the present disclosure, the complexity of circuit may decrease, costs necessary to manufacture the circuit may decrease, the circuit area may decrease, the power consumption of the circuit may decrease, and the heat generation of the circuit may decrease.

Figure 8:
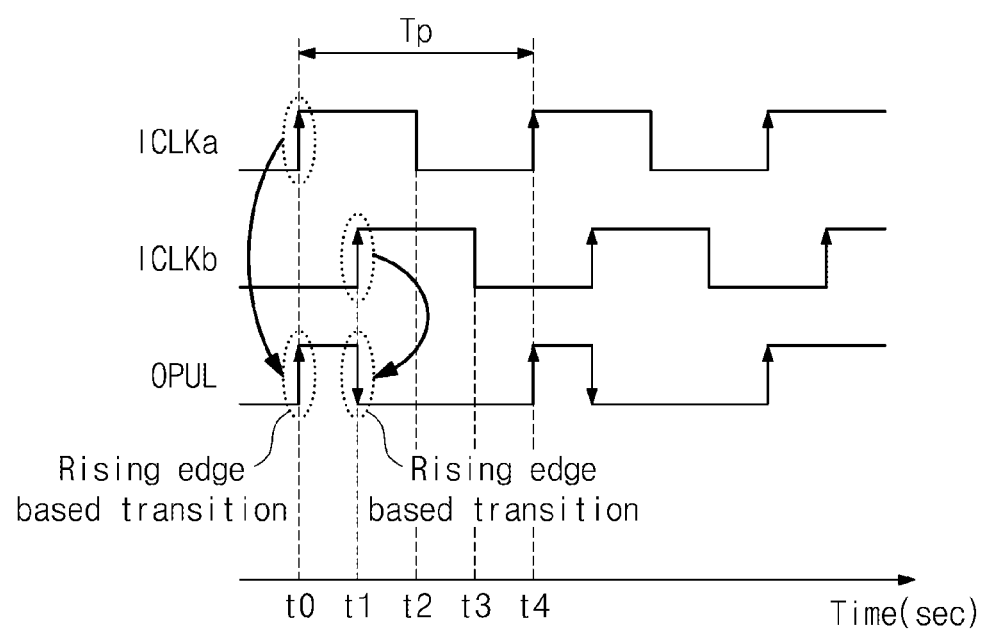
FIG. 8 is a timing diagram illustrating a relationship between first and second input clock signals and an output pulse signal associated with clock multiplexing circuits of FIGS. 5 to 7.

FIG. 8 is a timing diagram illustrating a relationship between first and second input clock signals and an output pulse signal associated with clock multiplexing circuits of FIGS. 5 to 7. In FIG. 8, a horizontal axis represents a time, and a vertical axis represents a logic level of a signal.

In FIG. 8, some embodiments where the first input clock signal ICLKa and the second input clock signal ICLKb are included in the 4-phase clock signal will be described. That is, the first input clock signal ICLKa and the second input clock signal ICLKb may have a phase difference of 90 degrees (i.e., 360/n degrees when "n" is 4).

Each of the clock multiplexing circuits 11a, 11b, and 110a of FIGS. 5 to 7 may generate the output pulse signal OPUL toggling in response to the rising edges of the first input clock signal ICLKa and the second input clock signal ICLKb. The logic levels of the first input clock signal ICLKa and the second input clock signal ICLKb in the period Tp and at the 0th time to, the first time t1, the second time t2, and a fourth time t4 are similar to those described with reference to FIG. 4, and thus, additional description will be omitted to avoid redundancy.

The second input clock signal ICLKb may transition from the logic high level to the logic low level at a third time t3. In this case, a time interval from the third time t3 to the second time t2 may be ¼ of the period Tp.

Referring to FIGS. 7 and 8, the logic level of the output pulse signal OPUL may correspond to the logic level of the third node N3. That is, while the second input clock signal ICLKb is at the logic high level, that is, in a time period between the first time t1 and the third time t3, the output pulse signal OPUL may be at the logic low level. While the second input clock signal ICLKb is at the logic low level, that is, in time periods between the 0th time t0 and the first time t1 and between the third time t3 and the fourth time t4, the logic level of the output pulse signal OPUL may be identical to the logic level of the first input clock signal ICLKa. For example, the output pulse signal OPUL may be at the logic high level in the time period between the 0th time t0 and the first time t1 and may be at the logic low level in the time period between the third time t3 and the fourth time t4.

That is, according to the embodiments of FIG. 7, the output pulse signal OPUL may transition to the logic high level at the 0th time t0 in response to the rising edge of the first input clock signal ICLKa. Also, the output pulse signal OPUL may transition to the logic low level at the first time t1 in response to the rising edge of the second input clock signal ICLKb. When the rising edge time point of the clock signal is accurately determined (i.e., even though an error occurs at the falling edge time point), the clock multiplexing circuit 110 may operate correctly.

Figure 9:
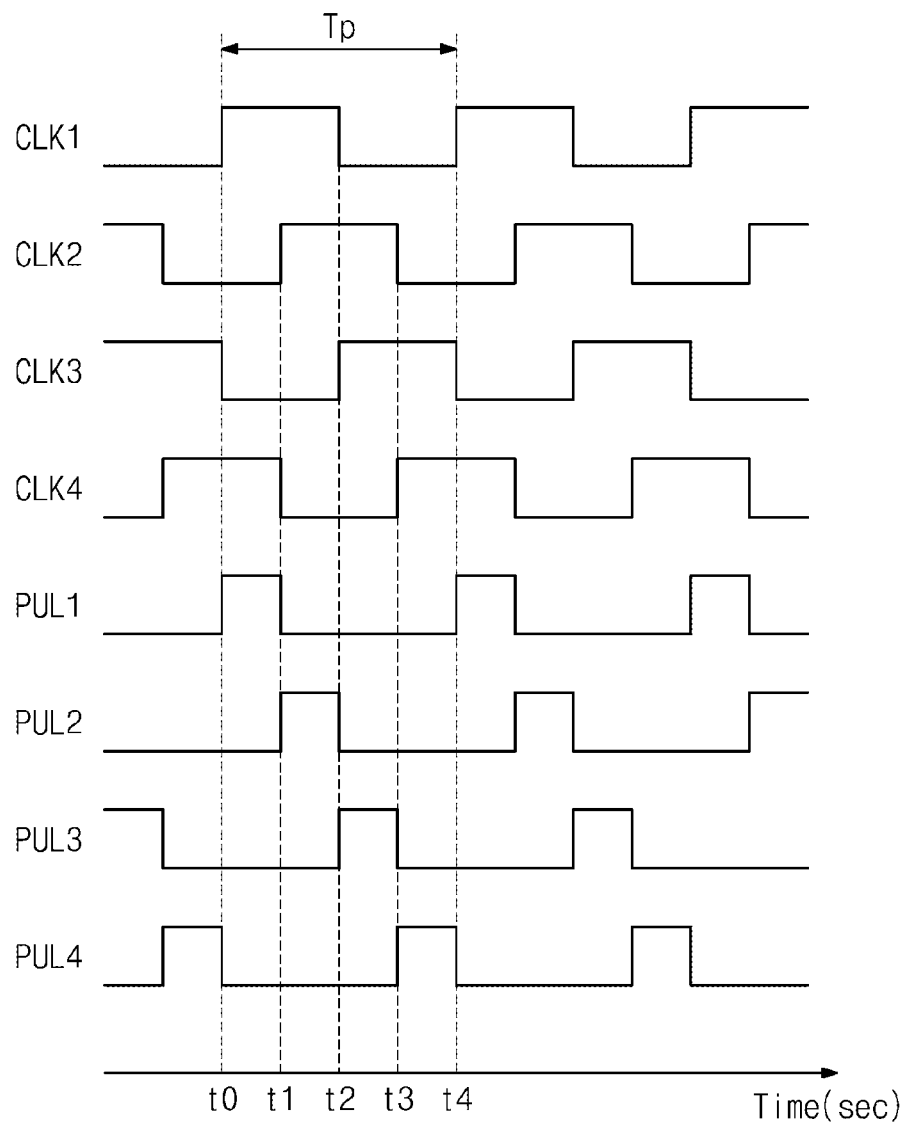
FIG. 9 is a timing diagram illustrating a relationship between clock signals and pulse signals of FIG. 1 when clock multiplexing circuits of FIG. 1 are implemented with a clock multiplexing circuit of FIG. 7.

FIG. 9 is a timing diagram illustrating a relationship between clock signals and pulse signals of FIG. 1 when clock multiplexing circuits of FIG. 1 are implemented with a clock multiplexing circuit of FIG. 7. In FIG. 9, some embodiments where "n" is 4 (i.e., the clock multiplexer 100 operates based on the 4-phase clock signal) will be described representatively. In FIG. 9, a horizontal axis represents a time, and a vertical axis represents a logic level of a signal.

Referring to FIGS. 1 and 7 to 9, the first to fourth clock signals CLK1 to CLK4 may have the same period Tp and may have different phases. For example, the first clock signal CLK1 may transition to the logic high level at the 0th time t0, the second clock signal CLK2 may transition to the logic high level at the first time t1, the third clock signal CLK3 may transition to the logic high level at the second time t2, and the fourth clock signal CLK4 may transition to the logic high level at the third time t3.

Each of the first to fourth clock multiplexing circuits 110_1 to 110_4 may be implemented to be identical to the clock multiplexing circuit 110a of FIG. 7. Each of the first to fourth clock multiplexing circuits 110_1 to 110_4 may receive two adjacent clock signals and may generate an output pulse. For example, the first clock multiplexing circuit 110_1 may receive the first clock signal CLK1 and the second clock signal CLK2 and may generate the first pulse signal PUL1. In this case, the first pulse signal PUL1 may be at the logic low level in the time period from t1 to t3 in which the second clock signal CLK2 is at the logic low level. In the time periods where the second clock signal CLK2 is at the logic low level, that is, in the time period from t0 to t1 and the time period from t3 to t4, the logic level of the first pulse signal PUL1 may be identical to the logic level of the first clock signal CLK1. For example, the first pulse signal PUL1 may be at the logic high level in the time period from t0 to t1 and may be at the logic low level in the time period from t3 to t4.

As in the above description, the second to fourth clock multiplexing circuits 110_2 to 110_4 may generate the second to fourth pulse signals PUL2 to PUL4, respectively. In this case, two pulse signals adjacent to each other from among the first to fourth pulse signals PUL1 to PUL4 may have a phase difference of 90 degrees. For example, the first pulse signal PUL1 may be at the logic high level from the 0th time t0 to the first time t1, the second pulse signal PUL2 may be at the logic high level from the first time t1 to the second time t2, the third pulse signal PUL3 may be at the logic high level from the second time t2 to the third time t3, and the fourth pulse signal PUL4 may be at the logic high level from the third time t3 to the fourth time t4.

In some embodiments, the first to fourth pulse signals PUL1 to PUL4 may be used as a control signal for an electronic circuit that is placed outside the pulse generator PG. For example, the first to fourth pulse signals PUL1 to PUL4 may be used for an operation of an input/output circuit of a memory device. Some embodiments where the pulse signal of the present disclosure is used for the operation of the input/output circuit of the memory device will be described in detail with reference to FIGS. 15 to 19.

Figure 10:
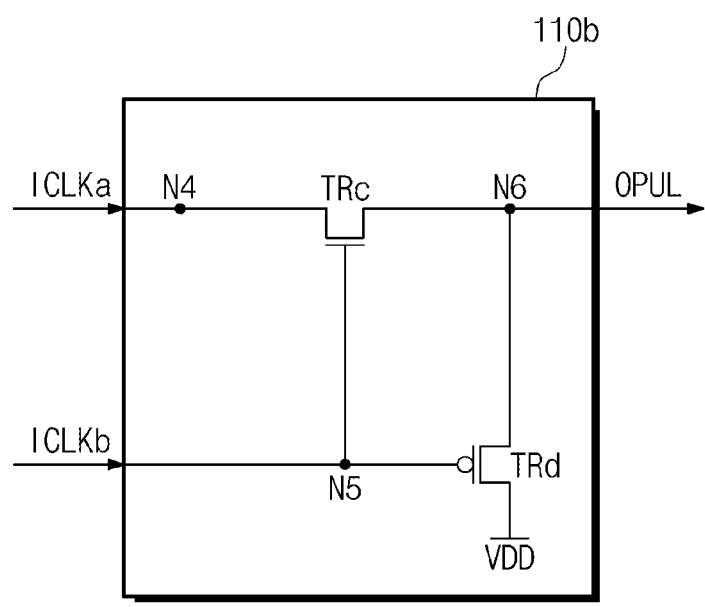
FIG. 10 is a circuit diagram illustrating a clock multiplexing circuit of FIG. 3, according to some embodiments of the present disclosure.

FIG. 10 is a circuit diagram illustrating a clock multiplexing circuit of FIG. 3, according to some embodiments of the present disclosure. Referring to FIG. a clock multiplexing circuit 110b may receive the first input clock signal ICLKa through a fourth node N4. The clock multiplexing circuit 110b may receive the second input clock signal ICLKb through a fifth node N5.

In some embodiments, the fourth node N4 may be connected with the first input terminal of the clock multiplexing circuit 110 of FIG. 3, the fifth node N5 may be connected with the second input terminal of the clock multiplexing circuit 110 of FIG. 3, and a sixth node N6 may be connected with the output terminal of the clock multiplexing circuit 110 of FIG. 3.

The clock multiplexing circuit 110b may include a third transistor TRc and a fourth transistor TRd. A channel of the third transistor TRc may be different in type from a channel of the fourth transistor TRd. For example, the third transistor TRc may be an NMOS transistor, and the fourth transistor TRd may be a PMOS transistor. However, the present disclosure is not limited thereto.

The third transistor TRc may be connected between the fourth node N4 and the sixth node N6. The third transistor TRc may operate in response to the logic level of the fifth node N5. For example, the third transistor TRc may operate in response to the logic level of the second input clock signal ICLKb input to the fifth node N5.

In detail, the third transistor TRc may be turned on when the second input clock signal ICLKb is at the logic high level. In this case, the logic level of the sixth node N6 may be set to the logic level of the fourth node N4 (i.e., the logic level of the first input clock signal ICLKa). In contrast, the third transistor TRc may be turned off when the second input clock signal ICLKb is at the logic low level.

The fourth transistor TRd may be connected between the sixth node N6 and the power supply voltage VDD. The fourth transistor TRd may operate in response to the logic level of the fifth node N5. For example, the fourth transistor TRd may operate in response to the logic level of the second input clock signal ICLKb input to the fifth node N5.

In detail, the fourth transistor TRd may be turned on when the second input clock signal ICLKb is at the logic low level. In this case, the logic level of the sixth node N6 may be set to the logic level (i.e., the logic high level) corresponding to the power supply voltage VDD. In contrast, the fourth transistor TRd may be turned off when the second input clock signal ICLKb is at the logic high level.

The logic level of the output pulse signal OPUL may correspond to the logic level of the sixth node N6. That is, when the second input clock signal ICLKb is at the logic low level, the logic level of the output pulse signal OPUL may be at the logic high level. When the second input clock signal ICLKb is at the logic high level, the logic level of the output pulse signal OPUL may be identical to the logic level of the first input clock signal ICLKa.

That is, the output pulse signal OPUL may toggle in response to edges of the input clock signals, which have the same type. For example, the output pulse signal OPUL may transition from the logic high level to the logic low level at the falling edge time point of the first input clock signal ICLKa, and may transition from the logic low level to the logic high level at the falling edge time point of the second input clock signal ICLKb.

In some embodiments, an inverter may be further connected with the sixth node N6 of the clock multiplexing circuit 110b. In this case, a signal that is output through the inverter may be referred to as an "inverse output pulse signal". Below, the inverse output pulse signal will be described in detail with reference to FIG. 11.

Figure 11:
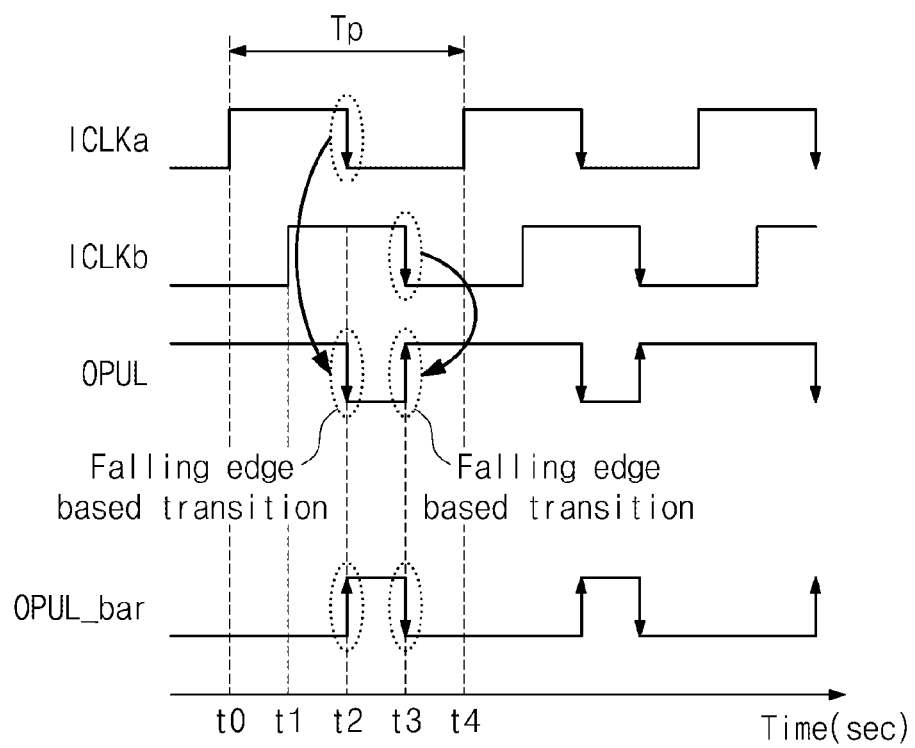
FIG. 11 is a timing diagram illustrating a relationship between first and second input clock signals and an output pulse signal associated with clock multiplexing circuits of FIG. 10.

FIG. 11 is a timing diagram illustrating a relationship between first and second input clock signals and an output pulse signal associated with clock multiplexing circuits of FIG. 10. In FIG. 11, a horizontal axis represents a time, and a vertical axis represents a logic level of a signal.

The logic levels of the first input clock signal ICLKa and the second input clock signal ICLKb in the period Tp and at the 0th time t0 to the fourth time t4 are similar to those described with reference to FIG. 4, and thus, additional description will be omitted to avoid redundancy.

Referring to FIGS. 10 and 11, the logic level of the output pulse signal OPUL may correspond to the logic level of the sixth node N6. While the second input clock signal ICLKb is at the logic low level, that is, in the time periods between the time t0 and the first time t1 and between the third time t3 and the fourth time t4, the output pulse signal OPUL may be at the logic high level. While the second input clock signal ICLKb is at the logic high level, that is, in the time period between the first time t1 and the third time t3, the logic level of the output pulse signal OPUL may be identical to the logic level of the first input clock signal ICLKa. For example, the output pulse signal OPUL may be at the logic high level in the time period between the first time t1 and the second time t2 and may be at the logic low level in the time period between the second time t2 and the third time t3.

That is, according to the embodiments of FIG. 10, the output pulse signal OPUL may transition to the logic low level at the second time t2 in response to the falling edge of the first input clock signal ICLKa. Also, the output pulse signal OPUL may transition to the logic high level at the third time t3 in response to the falling edge of the second input clock signal ICLKb.

In some embodiments, the logic level of an inverse output pulse signal OPUL bar may be opposite to the logic level of the output pulse signal OPUL. For example, the inverse output pulse signal OPUL bar may transition to the logic high level at the second time t2 in response to the falling edge of the first input clock signal ICLKa. Also, the inverse output pulse signal OPUL bar may transition to the logic low level at the third time t3 in response to the falling edge of the second input clock signal ICLKb.

Figure 12:
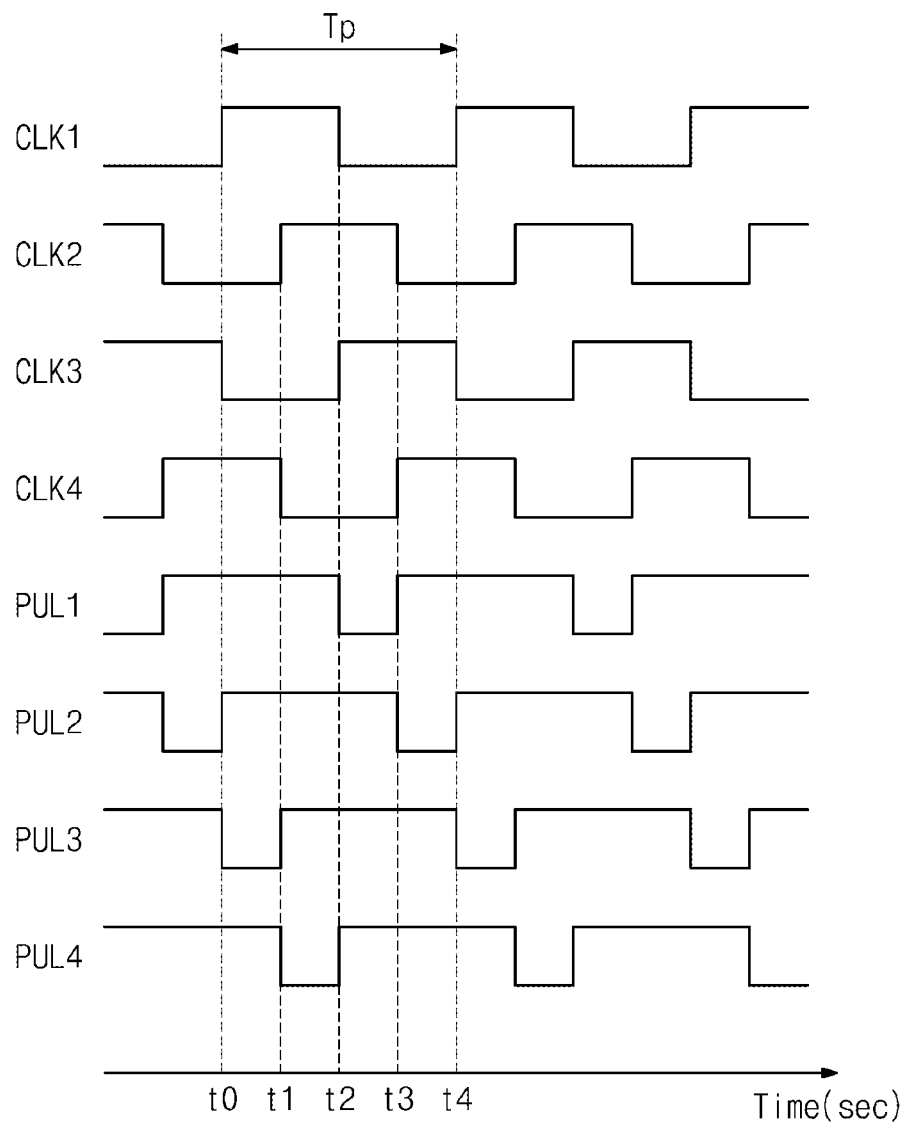
FIG. 12 is a timing diagram illustrating a relationship between clock signals and pulse signals of FIG. 1 when clock multiplexing circuits of FIG. 1 are implemented with a clock multiplexing circuit of FIG. 10.

FIG. 12 is a timing diagram illustrating a relationship between clock signals and pulse signals of FIG. 1 when clock multiplexing circuits of FIG. 1 are implemented with a clock multiplexing circuit of FIG. 10. In FIG. 12, a horizontal axis represents a time, and a vertical axis represents a logic level of a signal.

In FIG. 12, some embodiments where "n" is 4 (i.e., the clock multiplexer 100 operates based on the 4-phase clock signal) will be described representatively. Referring to FIGS. 1 and 10 to 12, the first to fourth clock signals CLK1 to CLK4 may have the same period Tp and may have different phases. The logic levels of the first to fourth clock signals CLK1 to CLK4 at the 0th to fourth times t0 to t4 are similar to those described with reference to FIG. 4, and thus, additional description will be omitted to avoid redundancy.

Each of the first to fourth clock multiplexing circuits 110_1 to 110_4 may be implemented to be identical to the clock multiplexing circuit 110b of FIG. 10. Each of the first to fourth clock multiplexing circuits 110_1 to 110_4 may receive two adjacent clock signals and may generate an output pulse. For example, the first clock multiplexing circuit 110_1 may receive the first clock signal CLK1 and the second clock signal CLK2 and may generate the first pulse signal PUL1 In this case, while the second input clock signal ICLKb is at the logic low level, that is, in the time periods between the 0th time t0 and the first time t1 and between the third time t3 and the fourth time t4, the first pulse signal PUL1 may be at the logic high level. While the second input clock signal ICLKb is at the logic high level, that is, in the time period between the first time t1 and the third time t3, the logic level of the first pulse signal PUL1 may be identical to the logic level of the first input clock signal ICLKa. For example, the first pulse signal PUL1 may be at the logic high level in the time period from t1 to t2 and may be at the logic low level in the time period from t2 to t3.

As in the above description, the second to fourth clock multiplexing circuits 110_2 to 110_4 may generate the second to fourth pulse signals PUL2 to PUL4, respectively. In this case, two pulse signals adjacent to each other from among the first to fourth pulse signals PUL1 to PUL4 may have a phase difference of 90 degrees. For example, the first output signal PUL1 may be at the logic low level from the second time t2 to the third time t3, the second output signal PUL2 may be at the logic low level from the third time t3 to the fourth time t4, the third output signal PUL3 may be at the logic low level from the 0th time t0 to the first time t1, and the fourth output signal PUL4 may be at the logic low level from the first time t1 to the second time t2.

In some embodiments, the first to fourth pulse signals PUL1 to PUL4 may be used as a control signal of an electronic circuit that is placed outside the pulse generator PG, i.e. external to the pulse generator PG. For example, the first to fourth pulse signals PUL1 to PUL4 may be used for an operation of an input/output circuit of a memory device. However, the present disclosure is not limited thereto. For example, signals whose phases are opposite to those of the first to fourth pulse signals PUL1 to PUL4 may be used for the operation of the input/output circuit of the memory device.

Figure 13:
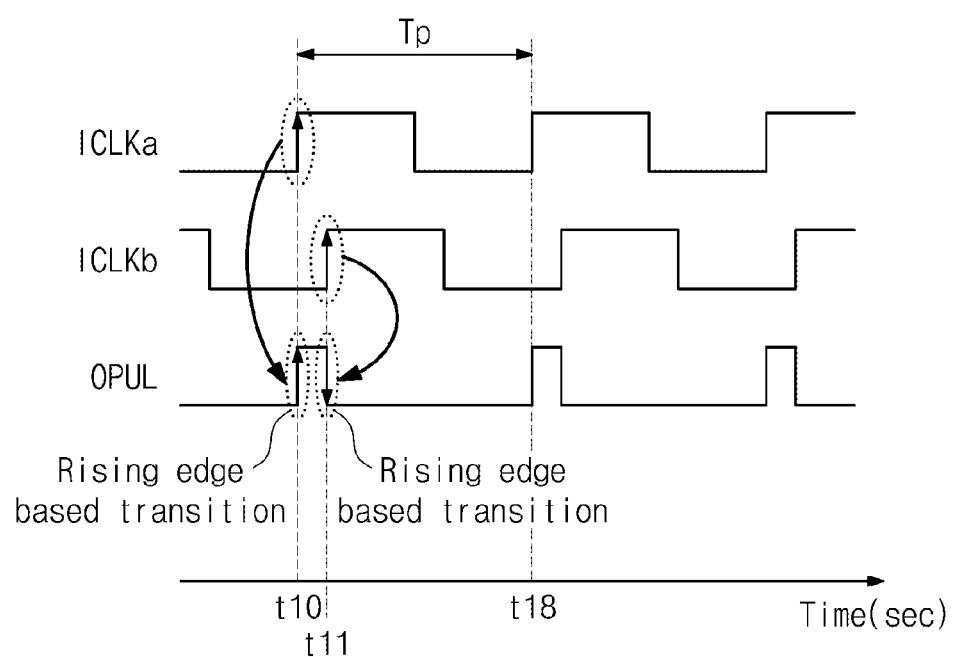
FIG. 13 is a timing diagram illustrating a relationship between first and second input clock signals and an output pulse signal associated with clock multiplexing circuits of FIGS. 7.

FIG. 13 is a timing diagram illustrating a relationship between first and second input clock signals and an output pulse signal associated with clock multiplexing circuits of FIG. 7. In FIG. 13, a horizontal axis represents a time, and a vertical axis represents a logic level of a signal.

In FIG. 13, some embodiments where the first input clock signal ICLKa and the second input clock signal ICLKb are included in an 8-phase clock signal will be described. That is, the first input clock signal ICLKa and the second input clock signal ICLKb may have a phase difference of 45 degrees (i.e., 360/n degrees when "n" is 8).

For example, referring to FIGS. 7 and 13, the first input clock signal ICLKa and the second input clock signal ICLKb may have the period Tp. In detail, the first input clock signal ICLKa may transition from the logic low level to the logic high level at a 10th time t10 and may transition from the logic low level to the logic high level at a 18th time t18. In this case, a time interval from the 10th time t10 to the 18th time t18 may be identical to the period Tp.

The second input clock signal ICLKb may transition from the logic low level to the logic high level at a 11th time t11. In this case, a time interval from the time t10 to the 11th time t11 may be ⅛ of the period Tp.

The output pulse signal OPUL may toggle in response to the rising edges of the first input clock signal ICLKa and the second input clock signal ICLKb (i.e., the logic level of the output pulse signal OPUL may transition in response thereto). For example, the output pulse signal OPUL may transition from the logic low level to the logic high level at the 10th time t10 when the first input clock signal ICLKa transitions from the logic low level to the logic high level and may transition from the logic high level to the logic low level at the 11th time t11 when the second input clock signal ICLKb transitions from the logic low level to the logic high level.

An output pulse signal that is generated based on two adjacent clock signals included in the 4-phase clock signal is described with reference to FIG. 8, and an output pulse signal that is generated based on two adjacent clock signals included in the 8-phase clock signal is described with reference to FIG. 13. However, the present disclosure is not limited thereto. The clock multiplexing circuit 110 according to some embodiments of the present disclosure may generate an output pulse signal based on an n-phase clock signal ("n" being an arbitrary integer), as well as the 4-phase clock signal. In detail, the clock multiplexing circuit 110 may generate an output pulse signal based on two adjacent clock signals (i.e., clock signals having a phase difference of 360/n degrees) included in the n-phase clock signal.

Figure 14:
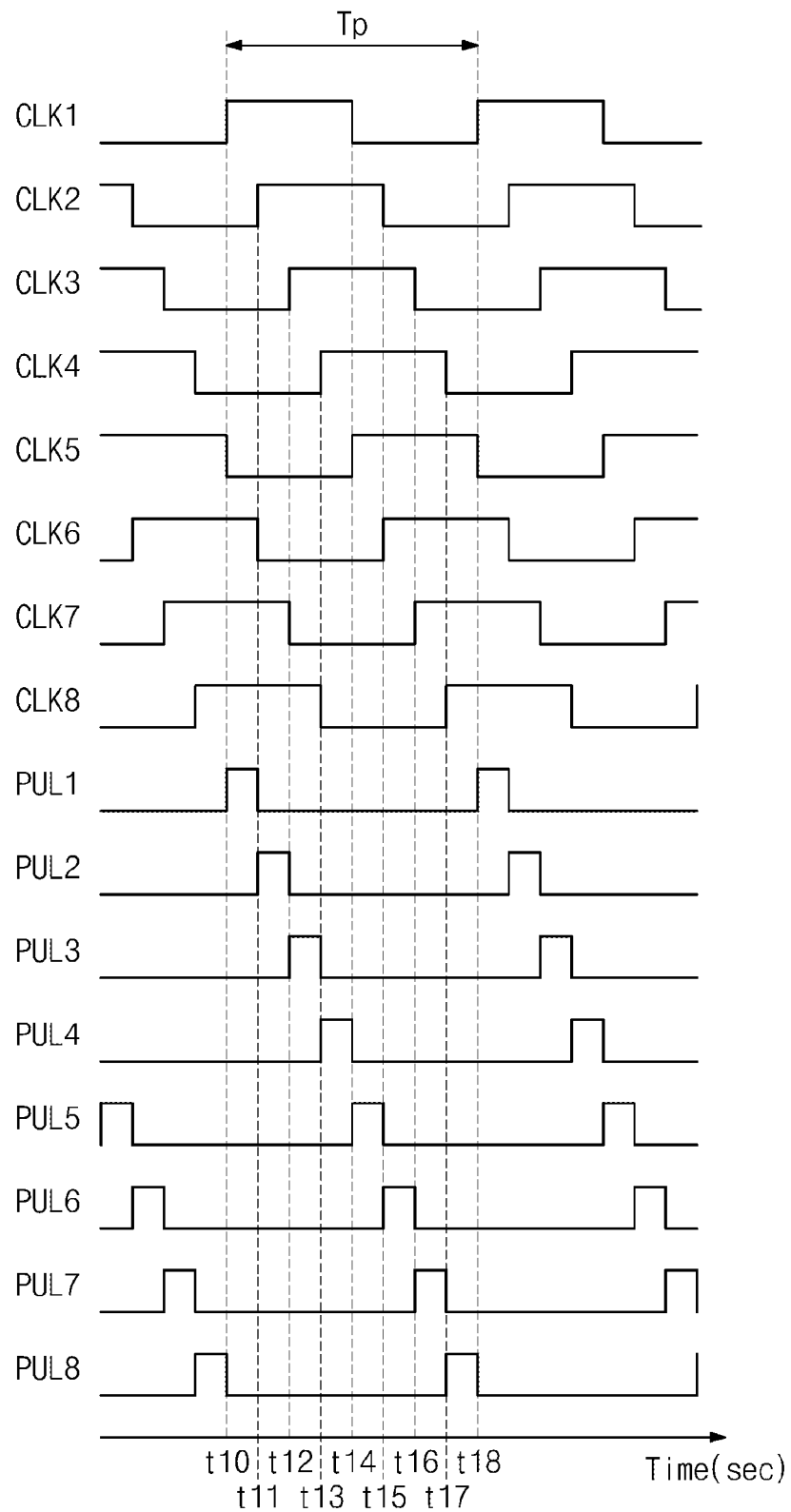
FIG. 14 is a timing diagram illustrating a relationship between clock signals and pulse signals of FIG. 1 when clock multiplexing circuits of FIG. 1 are implemented with a clock multiplexing circuit of FIG. 7.

FIG. 14 is a timing diagram illustrating a relationship between clock signals and pulse signals of FIG. 1 when clock multiplexing circuits of FIG. 1 are implemented with a clock multiplexing circuit of FIG. 7. In FIG. 14, a horizontal axis represents a time, and a vertical axis represents a logic level of a signal.

In FIG. 14, some embodiments where "n" is 8 (i.e., the clock multiplexer 100 operates based on the 8-phase clock signal) will be described representatively.

Referring to FIGS. 1, 7, 13, and 14, first to eighth clock signals CLK1 to CLK8 may have the same period Tp and may have different phases. For example, the first to eighth clock signals CLK1 to CLK8 may transition to the logic high level at 10th to 17th times t10 to t17, respectively.

Each of the first to eighth clock multiplexing circuits 110_1 to 110_8 may be implemented to be identical to the clock multiplexing circuit 110a of FIG. 7. Each of the first to eighth clock multiplexing circuits 110_1 to 110_8 may receive two adjacent clock signals and may generate an output pulse. For example, the first clock multiplexing circuit 110_1 may receive the first clock signal CLK1 and the second clock signal CLK2 and may generate the first pulse signal PUL1. In this case, the first pulse signal PUL1 may be at the logic low level in the time period from t11 to t15 in which the second clock signal CLK2 is at the logic low level. In the time periods where the second clock signal CLK2 is at the logic low level, that is, in the time period from t10 to t11 and the time period from t15 to t18, the logic level of the first pulse signal PUL1 may be identical to the logic level of the first clock signal CLK1. For example, the first pulse signal PUL1 may be at the logic high level in the time period from t10 to t11 and may be at the logic low level in the time period from t15 to t18.

As in the above description, the second to eighth clock multiplexing circuits 110_2 to 110_8 may generate the second to eighth pulse signals PUL2 to PUL8, respectively. In this case, two pulse signals adjacent to each other from among the first to eighth pulse signals PUL1 to PUL8 may have a phase difference of 45 degrees. The time period where each of the first to eighth pulse signals PUL1 to PUL8 is at the logic high level is determined in a manner similar to the above manner, and thus, additional description will be omitted to avoid redundancy.

Figure 15:
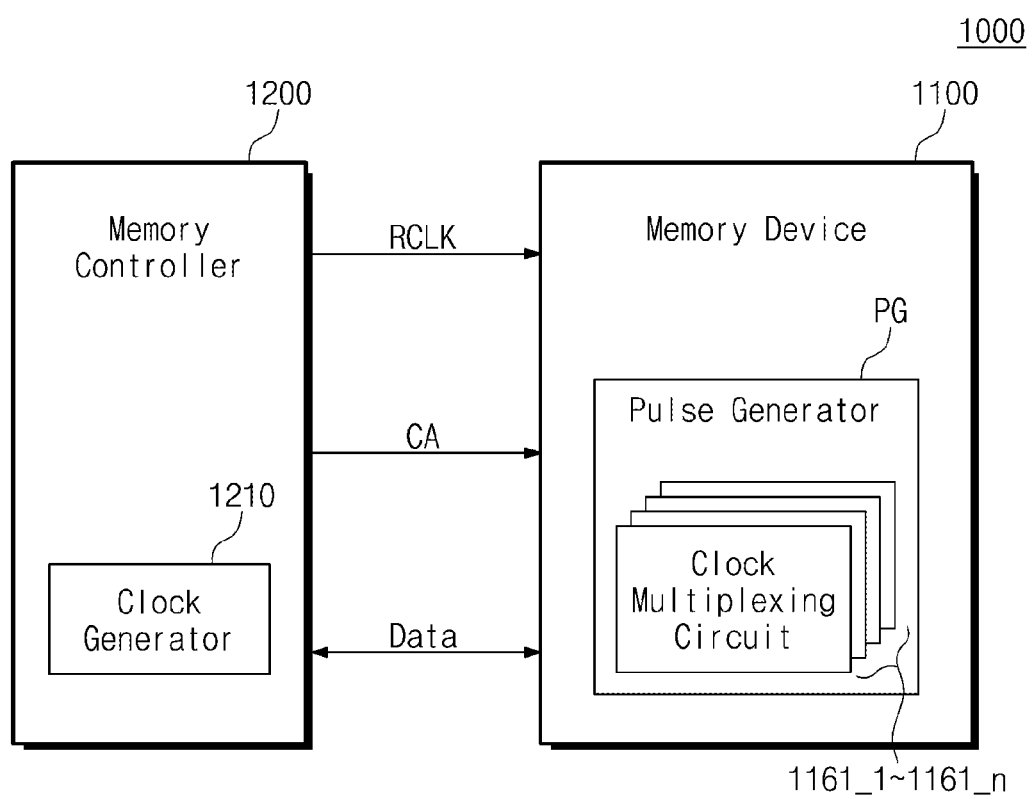
FIG. 15 is a block diagram illustrating a memory system according to some embodiments of the present disclosure.

FIG. 15 is a block diagram illustrating a memory system according to some embodiments of the present disclosure. Referring to FIG. 15, a memory system 1000 may include a memory device 1100 and a memory controller 1200.

The memory controller 1200 may include a clock generator 1210. The clock generator 1210 may generate the reference clock RCLK.

The memory controller 1200 may send the reference clock RCLK and a command/address CA to the memory device 1100. In response to the command/address CA, the memory device 1100 may store data provided from the memory controller 1200 or may provide data to the memory controller 1200.

In some embodiments, the memory device 1100 may be a dynamic random access memory (DRAM), and the memory controller 1200 and the memory device 1100 may communicate with each other based on a double data rate (DDR) interface. However, the present disclosure is not limited thereto. The memory device 1100 may be one of various memory devices such as a static random access memory (SRAM), a synchronous dynamic random access memory (SDRAM), a magnetic random access memory (MRAM), a ferroelectric random access memory (FRAM), and a resistive random access memory (ReRAM), and the memory device 1100 and the memory controller 1200 may communicate with each other based on various interfaces such as a low power double data rate (LPDDDR) interface, a universal serial bus (USB) interface, a multimedia card (MMC) interface, a peripheral component interconnection (PCI) interface, a peripheral component interconnection express (PCI-e) interface, an advanced technology attachment (ATA) interface, a serial advanced technology attachment (SATA) interface, a parallel advanced technology attachment (PATA) interface, a small computer system interface (SCSI), and an enhanced small disk interface (ESDI).

The memory device 1100 may include the pulse generator PG. The pulse generator PG may generate the n-phase clock signal based on the reference clock RCLK. That is, the pulse generator PG may generate first to n-th clock signals whose phases are different from each other, based on the reference clock RCLK.

In some embodiments, the first to n-th clock signals generated by the pulse generator PG may have the same period as the reference clock RCLK.

The pulse generator PG may include first to n-th clock multiplexing circuits 1161_1 to 1161_n. The pulse generator PG may generate the first to n-th pulse signals based on the n-phase clock signal. For example, the first to n-th clock multiplexing circuits 1161_1 to 1161_n may respectively generate the first to n-th pulse signals based on the n-phase clock signal.

Each of the first to n-th clock multiplexing circuits 1161_1 to 1161_n may receive two clock signals adjacent to each from among clock signals included in the n-phase clock signal and may generate a pulse signal. Each of the first to n-th clock multiplexing circuits 1161_1 to 1161_n may generate the pulse signal toggling in response to edges of the two clock signals having same type.

In some embodiments, the pulse generator PG may be implemented to be similar to the pulse generator described with reference to FIGS. 1 and 2. Also, each of the first to n-th clock multiplexing circuits 1161_1 to 1161_n may be implemented with the clock multiplexing circuit 110a described with reference to FIG. 7 or the clock multiplexing circuit 110b described with reference to FIG. 10. Below, for briefer description, some embodiments where each of the first to n-th clock multiplexing circuits 1161_1 to 1161_n is implemented with the clock multiplexing circuit 110a described with reference to FIG. 7 will be described representatively. However, the present disclosure is not limited thereto.

Figure 16:
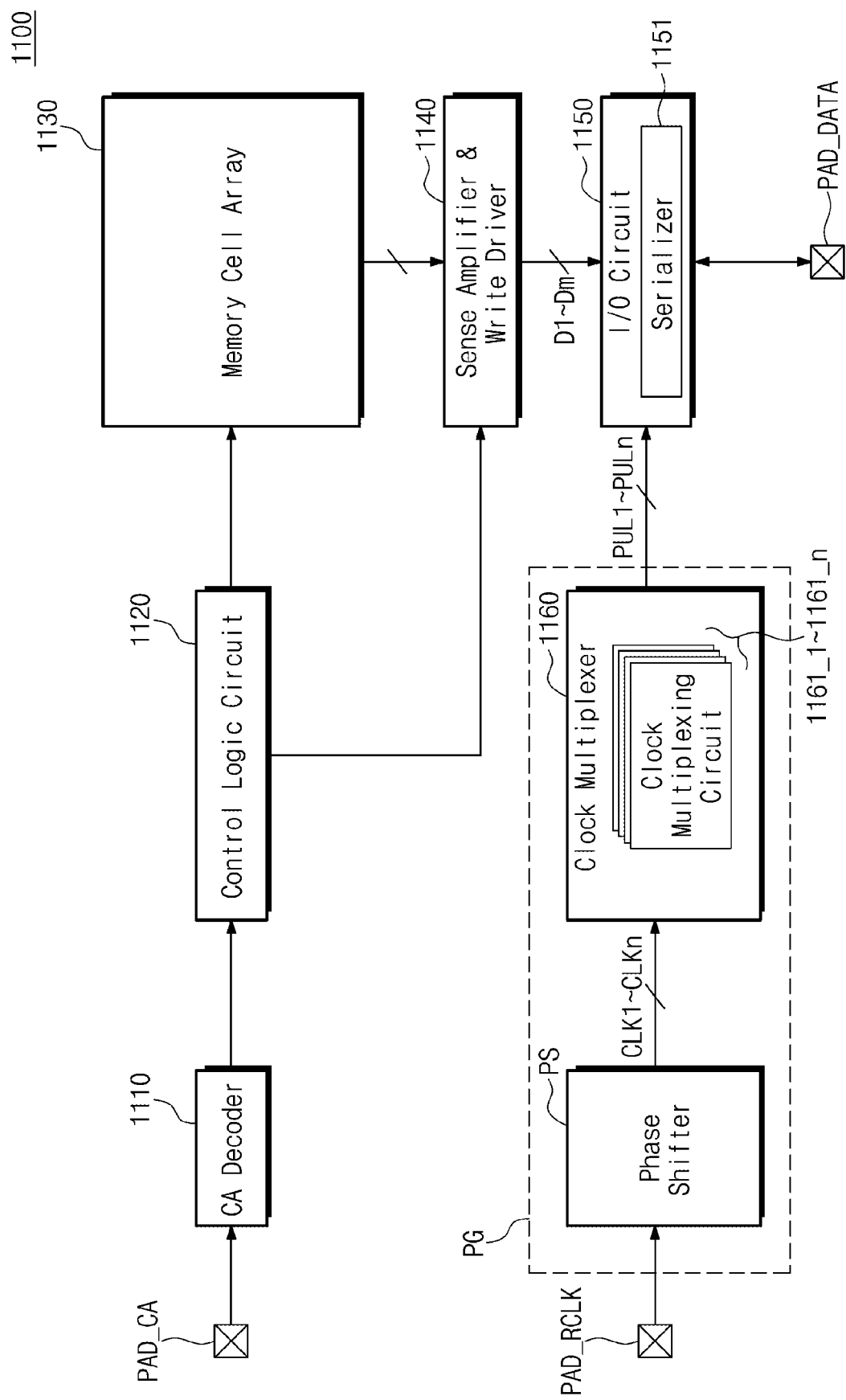
FIG. 16 is a block diagram illustrating a memory device of FIG. 15 in detail.

FIG. 16 is a block diagram illustrating a memory device of FIG. 15 in detail. Referring to FIGS. 15 and 16, the memory device 1100 may include the pulse generator PG, a command/address (CA) decoder 1110, a control logic circuit 1120, a memory cell array 1130, a sense amplifier and write driver 1140, and an input/output circuit 1150.

The pulse generator PG may include the phase shifter PS and a clock multiplexer 1160. The phase shifter PS may receive the reference clock RCLK from the memory controller 1200 through a reference clock pad PAD RCLK. The phase shifter PS may generate the n-phase clock signal based on the reference clock RCLK. Configurations and operations of the pulse generator PG and the phase shifter PS are similar those described with reference to FIG. 1, and thus, additional description will be omitted to avoid redundancy.

The clock multiplexer 1160 may include the first to n-th clock multiplexing circuits 1161_1 to 1161_n. The first to n-th clock multiplexing circuits 1161_1 to 1161_n may respectively output the first to n-th pulse signals PUL1 to PULn based on the n-phase clock signal.

In detail, each of the first to n-th clock multiplexing circuits 1161_1 to 1161_n may receive two clock signals adjacent to each other from among clock signals included in the n-phase clock signal and may generate a pulse signal. For example, the first clock multiplexing circuit 1161_1 may generate the first pulse signal PUL1 based on the first and second clock signals CLK1 and CLK2. As in the above description, the k-th clock multiplexing circuit 1161_k (k being an integer of 1 or more and (n−1) or less) may generate the k-th pulse signal PULk based on the k-th and (k+1)-th clock signals CLKk and CLKk+1. The n-th clock multiplexing circuit 1161_n may generate the n-th pulse signal PULn based on the th n-th and first clock signals CLKn and CLK1.

Configurations and operations of the clock multiplexer 1160 and the clock multiplexing circuits 1161_1 to 1161_n are similar to those of the clock multiplexer 100 and the clock multiplexing circuit 110 described with reference to FIGS. 1 to 14, and thus, additional description will be omitted to avoid redundancy.

The command/address decoder 1110 may receive the command/address CA from the memory controller 1200 through a command/address pad PAD CA and may decode the received command/address CA.

The control logic circuit 1120 may control an overall operation of the memory device 1100 in response to the decoded command/address CA. For example, when the command/address CA decoded by the command/address decoder 1110 corresponds to the read command, the control logic circuit 1120 may control the sense amplifier and write driver 1140 such that first to m-th data D1 to Dm are output from the memory cell array 1130 in parallel (e.g., simultaneously).

The input/output circuit 1150 may receive the first to m-th data D1 to Dm. The input/output circuit 1150 may provide the first to m-th data D1 to Dm to the memory controller 1200 through a data pad PAD_DATA, based on the first to n-th pulse signals PUL1 to PULn.

The input/output circuit 1150 may include a serializer 1151. The serializer 1151 sequentially (or serially) may provide the first to m-th data D1 to Dm to the memory controller 1200 through the data pad PAD_DATA in response to the first to n-th pulse signals PUL1 to PULn. A configuration of the serializer 1151 that operates based on the first to n-th pulse signals PUL1 to PULn will be described in detail with reference to FIGS. 17 and 18.

Figure 17:
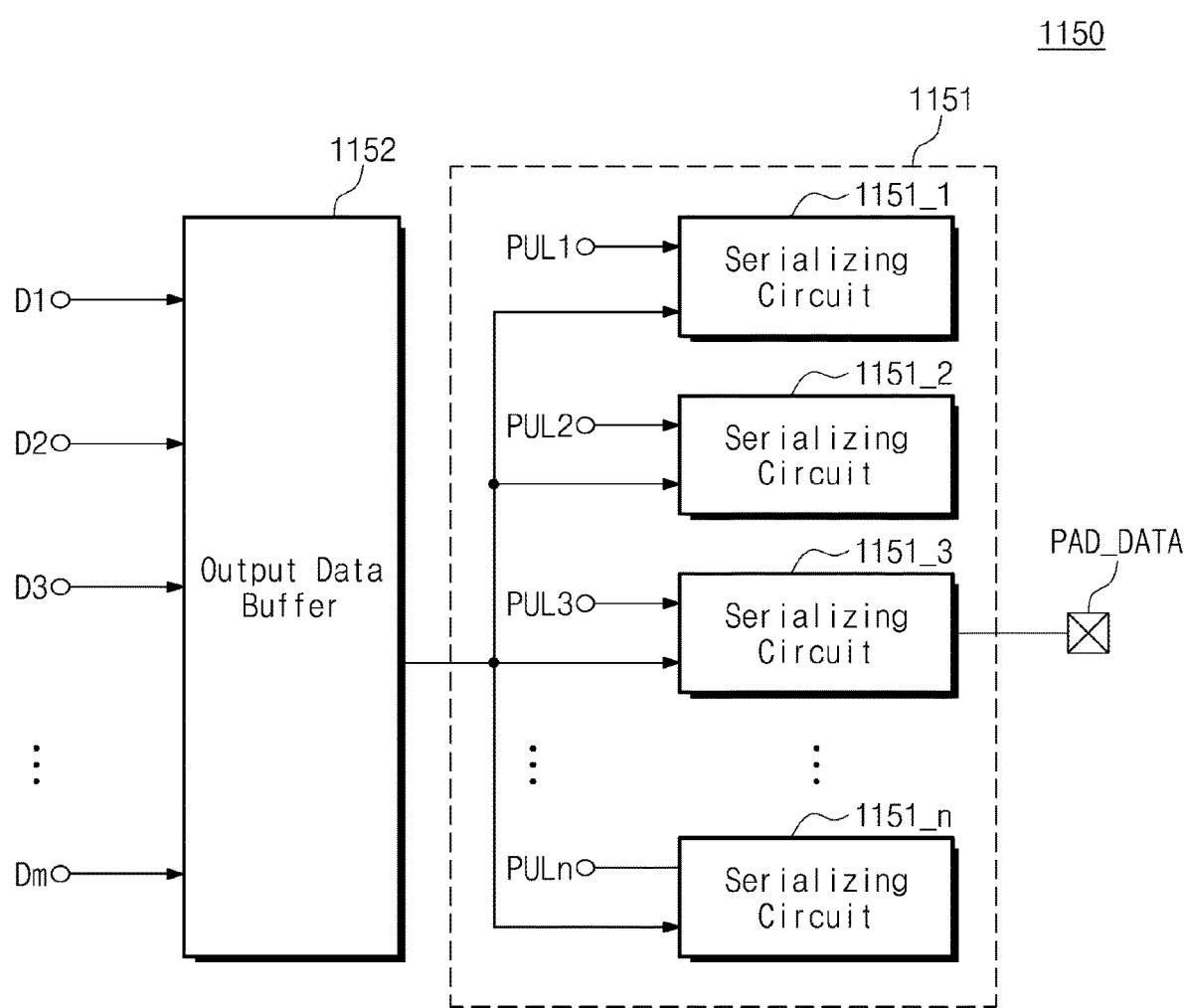
FIG. 17 is a block diagram illustrating an input/output circuit of FIG. 16 in detail.

FIG. 17 is a block diagram illustrating an input/output circuit of FIG. 16 in detail. Referring to FIGS. 15 to 17, the input/output circuit 1150 may include the serializer 1151 and an output data buffer 1152.

The output data buffer 1152 may receive the first to m-th data D1 to Dm in parallel. For example, the output data buffer 1152 may receive the first to m-th data D1 to Dm from different sub-memory cell array of the memory cell array 1130, respectively. That is, the output data buffer 1152 may receive the first to m-th data D1 to Dm simultaneously. The output data buffer 1152 may temporarily store the first to m-th data D1 to Dm thus received. The output data buffer 1152 may provide the stored first to m-th data D1 to Dm to the serializer 1151.

The serializer 1151 may include first to n-th serializing circuits 1151_1 to 1151_n. The first to n-th serializing circuits 1151_1 to 1151_n may respectively receive the first to n-th pulse signals PUL1 to PULn. Each of the first to n-th serializing circuits 1151_1 to 1151_n may operate in response to the received pulse signal. For example, when the received pulse signal is at the logic high level, each of the first to n-th serializing circuits 1151_1 to 1151_n may provide data stored in the output data buffer 1152 to the data pad PAD_DATA. In detail, the first serializing circuit 1151_1 may provide the data pad PAD_DATA with one (e.g., first data D1) of the data stored in the output data buffer 1152 in response to the first pulse signal PUL1 of the logic high level. How the serializer 1151 operates depending on the logic level of the pulse signal will be described in detail with reference to FIG. 18.

Figure 18:
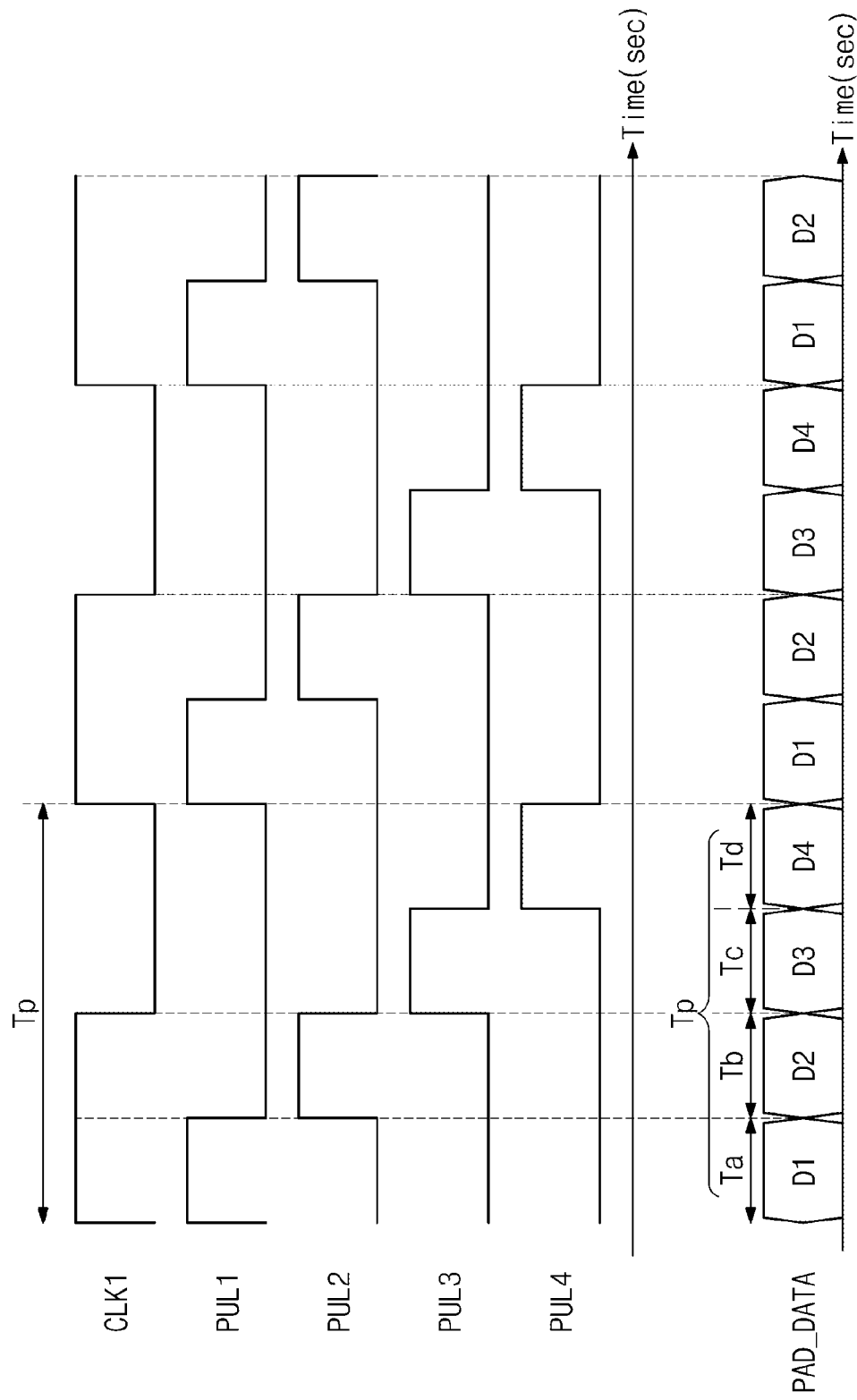
FIG. 18 is a timing diagram illustrating data output to a data pad based on a pulse signal of FIG. 17.

FIG. 18 is a timing diagram illustrating data output to data pad PAD_DATA based on a pulse signal of FIG. 17. Below, for briefer description, some embodiments where "n" and "m" are 4 will be described representatively. However, the present disclosure is not limited thereto. For example, "n" may be 8. In some embodiments, "n" may be an arbitrary integer of 4 or more.

Referring to FIGS. 17 and 18, data provided to the data pad PAD_DATA, the first clock signal CLK1, and the first to fourth pulse signals PUL1 to PUL4 are illustrated. In FIG. 18, a horizontal axis represents a time, and a vertical axis represents a logic state or a kind of data.

The first clock signal CLK1 and the first to fourth pulse signals PUL1 to PUL4 may have the period Tp. The first pulse signal PUL1 may be at the logic high level during a first time period Ta; the second pulse signal PUL2 may be at the logic high level during a second time period Tb; the third pulse signal PUL3 may be at the logic high level during a third time period Tc; the fourth pulse signal PUL4 may be at the logic high level during a fourth time period Td. In this case, a sum of lengths of the first to fourth time periods Ta to Td may be identical to a length of the period Tp. Transition timings of logic levels of the first to fourth pulse signals PUL1 to PUL4 are similar to those described with reference to FIGS. 7 to 9, and thus, additional description will be omitted to avoid redundancy.

The first serializing circuit 1151_1 may operate in response to the first pulse signal PUL1. For example, during the first time period Ta where the first pulse signal PUL1 is at the logic high level, the first serializing circuit 1151_1 may output the first data D1 to the data pad PAD_DATA. That is, in this case, the first data D1 may be provided to the memory controller 1200 during the first time period Ta.

As in the above description, second data D2 may be provided to the memory controller 1200 during the second time period Tb, third data D3 may be provided to the memory controller 1200 during the third time period Tc, and fourth data D4 may be provided to the memory controller 1200 during the fourth time period Td.

In some embodiments, "m" may be an integer of 4 or more. In this case, a plurality of data may be serially output through a serializing circuit. In some embodiments, "m" may be an integer of 4 or more.

For briefer description, in FIG. 18, the example case where "n" and "m" are equal is described representatively. However, the present disclosure is not limited thereto. For example, "m" may be an integer multiple of "n". In this case, the first to m-th data D1 to Dm simultaneously provided to the output data buffer 1152 may be output to the data pad PAD_DATA during a period of "m/n".

Figure 19:
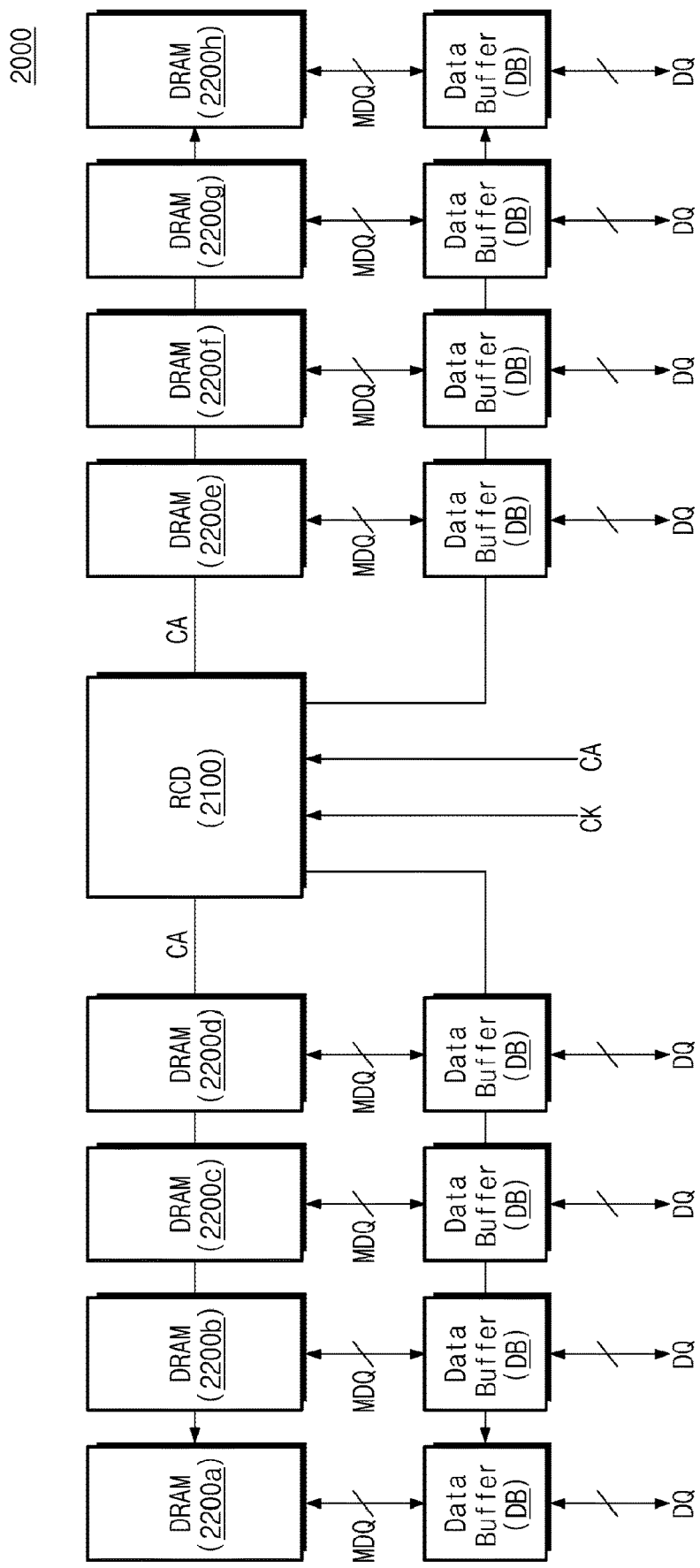
FIG. 19 is a block diagram illustrating a memory module to which a memory device of FIGS. 15 to 18 is applied.

FIG. 19 is a block diagram illustrating a memory module to which a memory device of FIGS. 15 to 18 is applied. Referring to FIGS. 15 to 19, a memory module 2000 may include a register clock driver (RCD) 2100, a plurality of DRAM devices 2200a to 2200h, and a plurality of data buffers DB. The RCD 2100 may receive the command/address CA and the clock CK from an external device (e.g., a host or a memory controller). In response to the received signals, the RCD 2100 may send the command/address CA to the plurality of DRAM devices 2200a to 2200h and may control the plurality of data buffers DB.

The plurality of DRAM devices 2200a to 2200h may be respectively connected with the plurality of data buffers DB through memory data lines MDQ. In some embodiments, each of the plurality of DRAM devices 2200a to 2200h may be implemented with the memory device 1100 of FIGS. 15 to 18 and may include the serializer 1151 operating in response to a pulse signal generated by the clock multiplexing circuit of FIG. 7 or 10. The plurality of data buffers DB may send and receive data to and from an external device (e.g., a host or a memory controller) through a plurality of data lines DQ.

In some embodiments, the memory module 2000 illustrated in FIG. 19 may have the form factor of a load reduced dual in-line memory module (LRDIMM). However, the inventive concept is not limited thereto. For example, the memory module 2000 may have the form factor of a registered DIMM (RDIMM) in which the plurality of data buffers DB are not included.

According to some embodiments of the present disclosure, a clock multiplexing circuit with a simpler structure may be provided. In detail, according to some embodiments of the present disclosure, manufacturing costs of the clock multiplexing circuit may be reduced, and the clock multiplexing circuit may operate with a lower power.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A clock multiplexing circuit comprising:
a first transistor that is between a first input terminal that is configured to receive a first input clock signal and an output terminal that is configured to output an output pulse signal, wherein the first transistor is configured to operate based on a logic level of a second input terminal that is configured to receive a second input clock signal; and
a second transistor that is between the output terminal and a first voltage node, wherein the second transistor is configured to operate based on the logic level of the second input terminal,
wherein the first input clock signal and the second input clock signal have a same period and have different phases, and
wherein the output pulse signal transitions to a first logic level at a first time when the first input clock signal transitions to the first logic level and transitions to a second logic level at a second time when the second input clock signal transitions to the first logic level.

2. The clock multiplexing circuit of claim 1, wherein the first transistor comprises an n-channel metal-oxide-semiconductor (NMOS) transistor, the second transistor comprises a p-channel metal-oxide-semiconductor (PMOS) transistor, and the first voltage node is at a power supply voltage.

3. The clock multiplexing circuit of claim 2, wherein the first logic level is lower than the second logic level.

4. The clock multiplexing circuit of claim 1, wherein the first transistor comprises a p-channel metal-oxide-semiconductor (PMOS) transistor, the second transistor comprises an n-channel metal-oxide-semiconductor (NMOS) transistor, and the first voltage node is at a ground voltage.

5. The clock multiplexing circuit of claim 3, wherein the first logic level is higher than the second logic level.

6. The clock multiplexing circuit of claim 1, wherein a phase difference between the first clock signal and the second clock signal corresponds to a time interval from the first time to the second time.

7. A pulse generator comprising:
a phase shifter configured to output a 4-phase clock signal including a first, second, third, and fourth clock signals whose phases are different from each other; and
a clock multiplexer comprising a first, second, third, and fourth clock multiplexing circuits,
wherein the first, second, third, and fourth clock multiplexing circuits respectively output a first, second, third, and fourth pulse signals having different phases from one another based on the 4-phase clock signal,
wherein the first clock multiplexing circuit comprises:
a first transistor that is between a first input node configured to receive the first clock signal and an output node, wherein the first transistor is configured to output the first pulse signal at the output node, and is configured to operate based on a logic level of a second input node that is configured to receive the second clock signal; and
a second transistor that is between the first output node and a first voltage node, wherein the second transistor is configured to operate based on the logic level of the second input node.

8. The pulse generator of claim 7, wherein the second clock signal lags the first clock signal by 90 degrees,
wherein the third clock signal lags the first clock signal by 180 degrees, and
wherein the fourth clock signal lags the first clock signal by 270 degrees.

9. The pulse generator of claim 7, wherein the first clock multiplexing circuit is configured to generate the first pulse signal based on the first and second clock signals,
wherein the second clock multiplexing circuit is configured to generate the second pulse signal based on the second and third clock signals,
wherein the third clock multiplexing circuit is configured to generate the third pulse signal based on the third and fourth clock signals, and
wherein the fourth clock multiplexing circuit is configured to generate the fourth pulse signal based on the fourth and first clock signals.

10. The pulse generator of claim 9, wherein the second clock multiplexing circuit comprises:
a third transistor that is between the second input node and a second output node, wherein the third transistor is configured to output the second pulse signal and is configured to operate based on a logic level of a third input node that is configured to receive the third clock signal; and a fourth transistor that is between the second output node and the first voltage node, wherein the fourth transistor is configured to operate based on the logic level of the third input node, wherein the third clock multiplexing circuit comprises:

a fifth transistor that is between the third input node and a third output node, wherein the fifth transistor is configured to output the third pulse signal and is configured to operate based on a logic level of a fourth input node that is configured to receive the fourth clock signal; and a sixth transistor that is between the third output node and the first voltage node, wherein the sixth transistor is configured to operate based on the logic level of the fourth input node, and wherein the fourth clock multiplexing circuit comprises:

a seventh transistor that is between the fourth input node and a fourth output node, wherein the seventh transistor is configured to output the fourth pulse signal and configured to operate based on a logic level of the first input node; and an eighth transistor that is between the fourth output node and the first voltage node, wherein the seventh transistor is configured to operate based on the logic level of the first input node.

11. The pulse generator of claim 7, wherein the first transistor comprises an n-channel metal-oxide-semiconductor (NMOS) transistor, the second transistor comprises a p-channel metal-oxide-semiconductor (PMOS) transistor, and the first voltage node is at a power supply voltage.

12. The pulse generator of claim 11, wherein the first pulse signal transitions to a logic low level in response to the first clock signal transitioning to the logic low level and transitions to a logic high level in response to the second clock signal transitioning to the logic low level.

13. The pulse generator of claim 7, wherein the first transistor comprises a p-channel metal-oxide-semiconductor (PMOS) transistor, the second transistor comprises an n-channel metal-oxide-semiconductor (NMOS) transistor, and the first voltage node is at a ground voltage.

14. The pulse generator of claim 13, wherein the first pulse signal transitions to a logic high level in response to the first clock signal transitioning to the logic high level and transitions to a logic low level in response to the second clock signal transitioning to the logic high level.

15. A memory device comprising:
a clock multiplexer configured to generate first to n-th pulse signals based on an n-phase clock signal comprising first to n-th clock signals, wherein n is a natural number equal to or greater than 4;
a memory cell array configured to output first to m-th data in parallel, wherein m is a natural number equal to or greater than 4; and
a serializer configured to sequentially output the first to m-th data to a first data pad in response to the first to n-th pulse signals,
wherein the clock multiplexer comprises first to n-th clock multiplexing circuits configured to generate the first to n-th pulse signals, respectively, wherein the first clock multiplexing circuit comprises:
a first transistor that is between a first input node and a first output node, wherein the first transistor is configured to output the first pulse signal and configured to operate based on a logic level of a second input node receiving a second clock signal among the first to n-th clock signals; and
a second transistor that is between the first output node and a first voltage node, wherein the second transistor is configured to operate based on the logic level of the second input node.

16. The memory device of claim 15, wherein a k-th clock multiplexing circuit is configured to generate a k-th pulse signal based on a k-th clock signal and a (k+1)-th clock signal, wherein k is a natural number of 1 or more and (n−1) or less, and
wherein the n-th clock multiplexing circuit is configured to generate the n-th pulse signal based on the n-th clock signal and the first clock signal.

17. The memory device of claim 16, wherein the k-th clock multiplexing circuit comprises:
a (2k−1)-th transistor that is between a k-th input node and a k-th output node, wherein the (2k−1)-th transistor is configured to output the k-th pulse signal and configured to operate based on a logic level of a (k+1)-th input node receiving the (k+1)-th clock signal; and
a 2k-th transistor that is between the k-th output node and the first voltage node, wherein the 2k-th transistor is configured to operate based on the logic level of the (k+1)-th input node,
wherein the n-th clock multiplexing circuit comprises:
a (2n−1)-th transistor that is between the n-th input node and an n-th output node, wherein the (2n−1)-th transistor is configured to output the n-th pulse signal and configured to operate based on a logic level of the first input node that is configured to receive the first clock signal; and
a 2n-th transistor that is between the n-th output node and the first voltage node, wherein the 2n-th transistor is configured to operate based on the logic level of the first input node.

18. The memory device of claim 15, wherein the first transistor comprises a p-channel metal-oxide-semiconductor (PMOS) transistor, the second transistor comprises an n-channel metal-oxide-semiconductor (NMOS) transistor, and the first voltage node is at a ground voltage, and
wherein the first pulse signal transitions to a logic high level in response to the first clock signal transitioning to the logic high level and transitions to a logic low level in response to the second clock signal transitioning to the logic high level.

19. The memory device of claim 18, wherein the serializer comprises:
an output data buffer configured to receive the first to m-th data in parallel; and
first to n-th serializing circuits configured to receive the first to n-th pulse signals, respectively,
wherein each of the first to n-th serializing circuits is configured to transfer one of the first to m-th data from the output data buffer to the first data pad during a time period where a respective one of the first to n-th pulse signals is at the logic high level.

20. The memory device of claim 19, wherein m is an integer multiple of n.

* * * * *